United States Patent
Plaisted et al.

(10) Patent No.: US 11,020,852 B2
(45) Date of Patent: Jun. 1, 2021

(54) SUBSTRATE TRANSPORT APPARATUS WITH INDEPENDENT ACCESSORY FEEDTHROUGH

(71) Applicant: Brooks Automation, Inc., Chelmsford, MA (US)

(72) Inventors: Sean E Plaisted, Newburyport, MA (US); Leigh F Sharrock, Londonderry, NH (US); Chris Aitken, Berkshire (GB)

(73) Assignee: BROOKS AUTOMATION, INC., Chelmsford, MA (US)

(*) Notice: Subject to any disclaimer, the term of this patent is extended or adjusted under 35 U.S.C. 154(b) by 0 days.

(21) Appl. No.: 16/151,598

(22) Filed: Oct. 4, 2018

(65) Prior Publication Data
US 2019/0105770 A1    Apr. 11, 2019

Related U.S. Application Data

(60) Provisional application No. 62/568,541, filed on Oct. 5, 2017.

(51) Int. Cl.
| | |
|---|---|
| *B25J 9/04* | (2006.01) |
| *B25J 9/06* | (2006.01) |
| *B25J 9/10* | (2006.01) |
| *H01L 21/683* | (2006.01) |
| *B25J 17/02* | (2006.01) |

(Continued)

(52) U.S. Cl.
CPC ............. *B25J 9/042* (2013.01); *B25J 9/06* (2013.01); *B25J 9/106* (2013.01); *B25J 9/107* (2013.01); *B25J 9/1615* (2013.01); *B25J 15/0052* (2013.01); *B25J 17/0283* (2013.01); *H01L 21/67265* (2013.01); *H01L 21/67742* (2013.01); *H01L 21/67766* (2013.01); *H01L 21/6838* (2013.01); *H01L 21/68707* (2013.01)

(58) Field of Classification Search
CPC .... B25J 9/0021; B25J 9/042; H01L 21/67766
See application file for complete search history.

(56) References Cited

U.S. PATENT DOCUMENTS 4,181,465 A * 1/1980 Ridderstrom .............. B25J 9/10
310/38
4,555,217 A    11/1985 Wright
(Continued)

OTHER PUBLICATIONS

International Search Report, International Application No. PCT/US2018/54525 dated Jan. 23, 2019.

*Primary Examiner* — Gerald McClain
(74) *Attorney, Agent, or Firm* — Perman & Green, LLP; Colin C. Durham

(57) ABSTRACT

A substrate transport apparatus including; a frame, a substrate transport arm connected to the frame, the substrate transport arm having an end effector, and a drive section having at least one motor coupled to the substrate transport arm, wherein the at least one motor defines a kinematic portion of the drive section configured to effect kinematic motion of the substrate transport arm, and the drive section includes an accessory portion adjacent the kinematic portion, wherein the accessory portion has another motor, different and distinct from the at least one motor, the another motor of the accessory portion is operably coupled to and configured to drive one or more accessory device independent of the kinematic motion of the substrate transport arm.

33 Claims, 23 Drawing Sheets

(51) Int. Cl.
  *B25J 15/00* (2006.01)
  *H01L 21/687* (2006.01)
  *B25J 9/16* (2006.01)
  *H01L 21/677* (2006.01)
  *H01L 21/67* (2006.01)

(56) References Cited

U.S. PATENT DOCUMENTS

| | | |
|---|---|---|
| 4,606,695 A | 8/1986 | Lenz |
| 4,897,015 A | 1/1990 | Abbe et al. |
| 5,007,784 A | 4/1991 | Genov et al. |
| 5,700,046 A | 12/1997 | Van Doren et al. |
| 5,789,890 A * | 8/1998 | Genov ............... B25J 9/1615 |
| | | 318/567 |
| 6,121,743 A | 9/2000 | Genov et al. |
| 6,155,773 A | 12/2000 | Ebbing et al. |
| 6,256,555 B1 | 7/2001 | Bacchi et al. |
| 6,296,635 B1 | 10/2001 | Smith et al. |
| 6,322,312 B1 | 11/2001 | Sundar |
| 6,435,807 B1 | 8/2002 | Todorov et al. |
| 6,468,022 B1 | 10/2002 | Whitcomb |
| 6,491,330 B1 | 12/2002 | Mankame et al. |
| 6,514,033 B2 | 2/2003 | Sundar |
| 6,623,235 B2 | 9/2003 | Yokota et al. |
| 6,786,896 B1 | 9/2004 | Madhani et al. |
| 6,909,276 B2 | 6/2005 | Hofer et al. |
| 7,233,842 B2 | 6/2007 | Bacchi et al. |
| 7,712,808 B2 | 5/2010 | Hofmeister et al. |
| 8,376,428 B2 | 2/2013 | Rebstock |
| 8,551,114 B2 | 10/2013 | Ramos De La Pena |
| 8,628,288 B2 | 1/2014 | Duhamel et al. |
| 8,651,539 B1 | 2/2014 | Rebstock |
| 8,998,561 B2 | 4/2015 | Furuya |
| 9,076,830 B2 * | 7/2015 | Kremerman ............ B25J 9/044 |
| 9,352,471 B1 | 5/2016 | Velazquez et al. |
| 9,375,838 B2 | 6/2016 | Suzuki |
| 9,401,296 B2 | 7/2016 | Hosek |
| 10,155,309 B1 * | 12/2018 | Blank ............... H01L 21/67201 |
| 2001/0018591 A1 | 8/2001 | Brock et al. |
| 2003/0052498 A1 | 3/2003 | Holbrooks |
| 2007/0020081 A1 | 1/2007 | Gilchrist et al. |
| 2008/0213076 A1 | 9/2008 | Hanson et al. |
| 2009/0087288 A1 | 4/2009 | Hofmeister et al. |
| 2014/0205416 A1 * | 7/2014 | Hosek ..................... B25J 9/042 |
| | | 414/744.6 |
| 2016/0064263 A1 | 3/2016 | Hosek et al. |
| 2016/0263742 A1 * | 9/2016 | Hosek ............... H01L 21/67742 |
| 2016/0293467 A1 * | 10/2016 | Caveney ........... H01L 21/67259 |

* cited by examiner

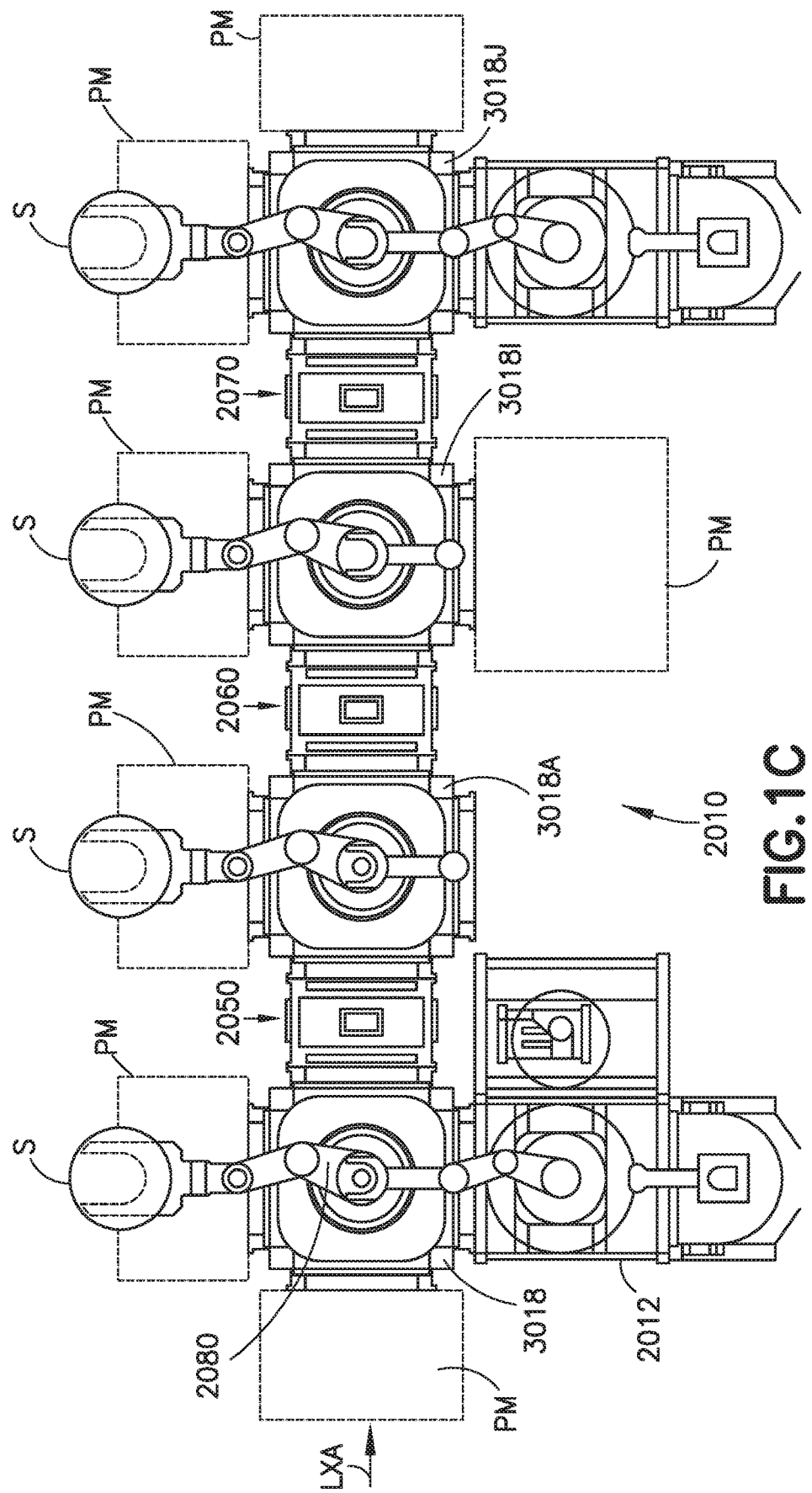

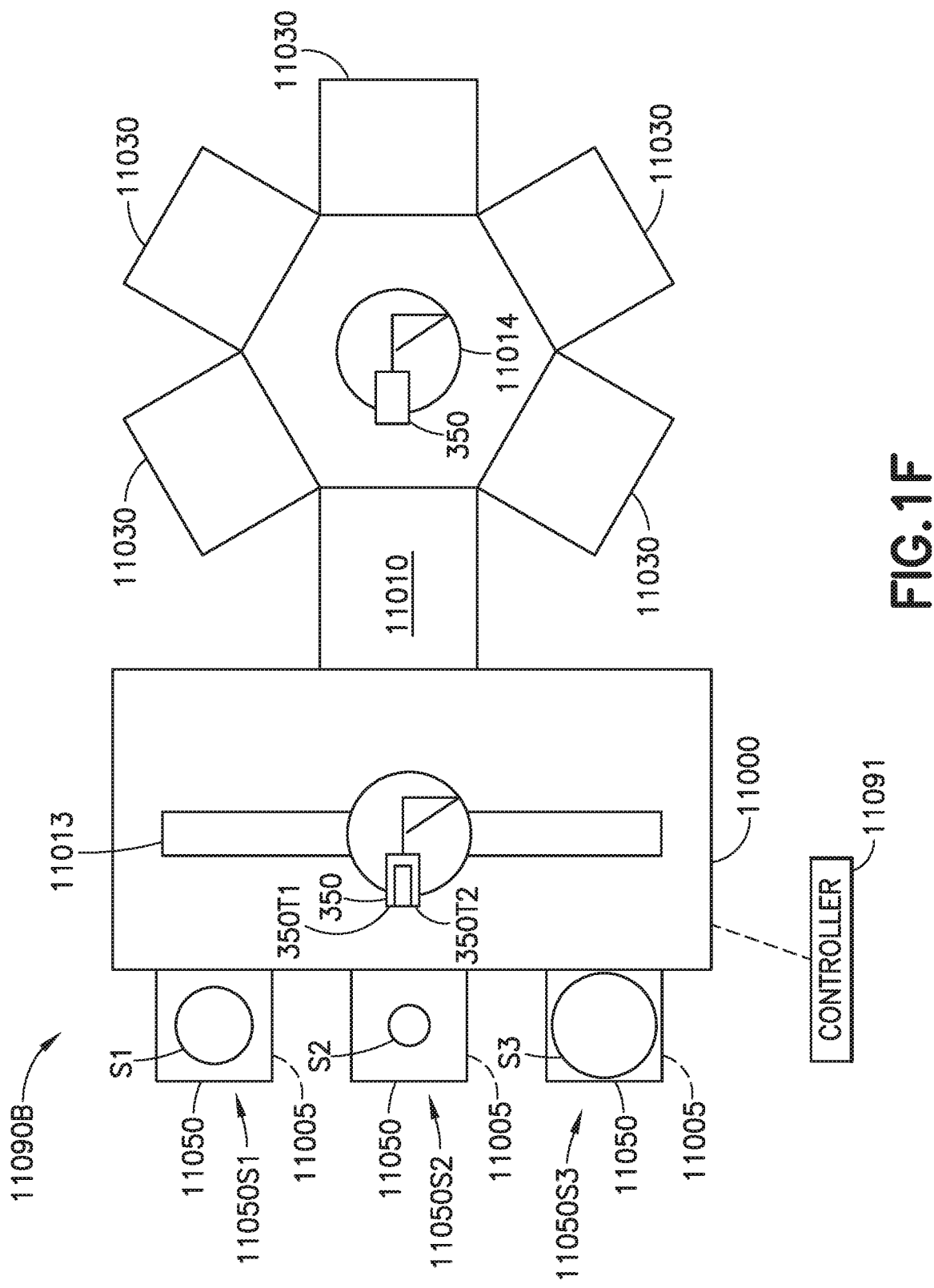

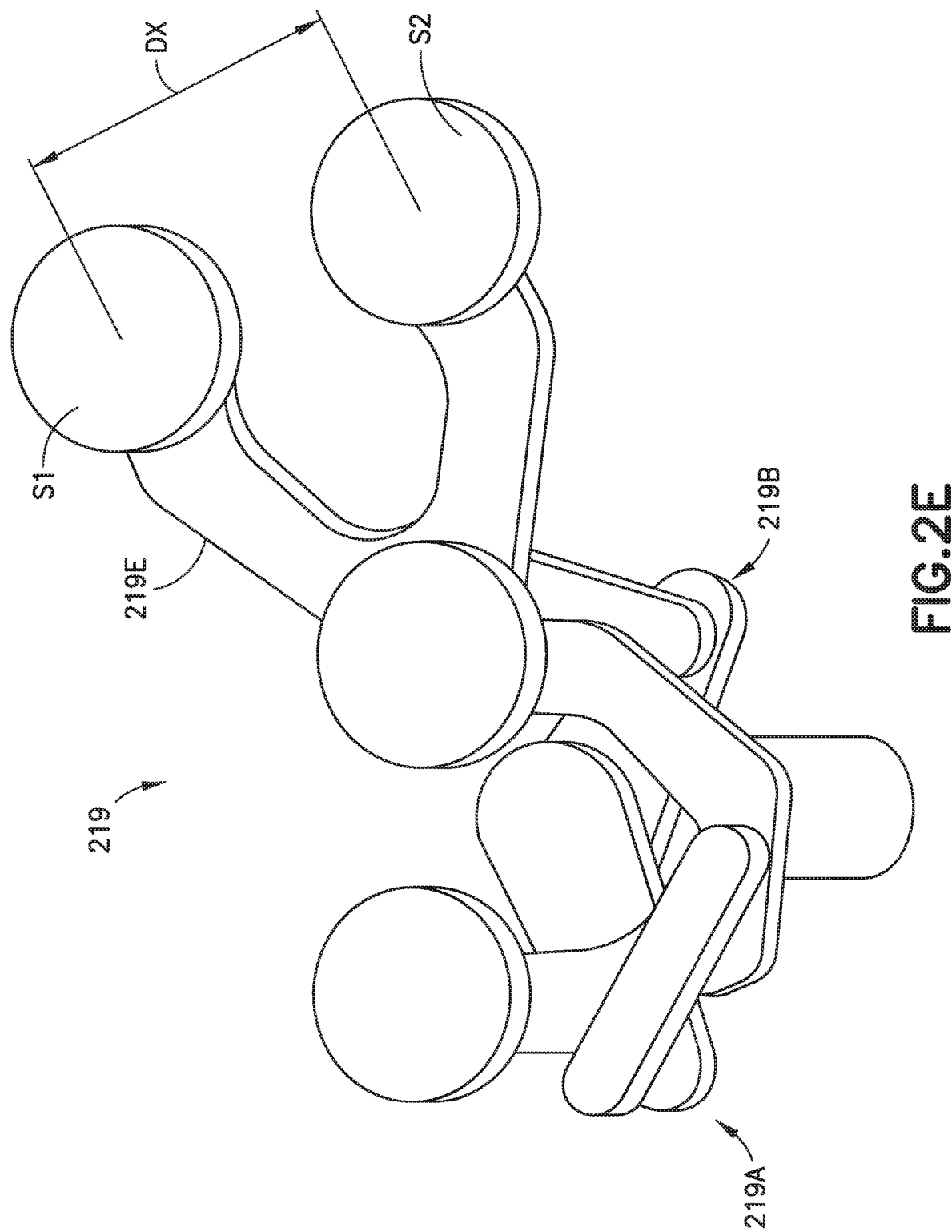

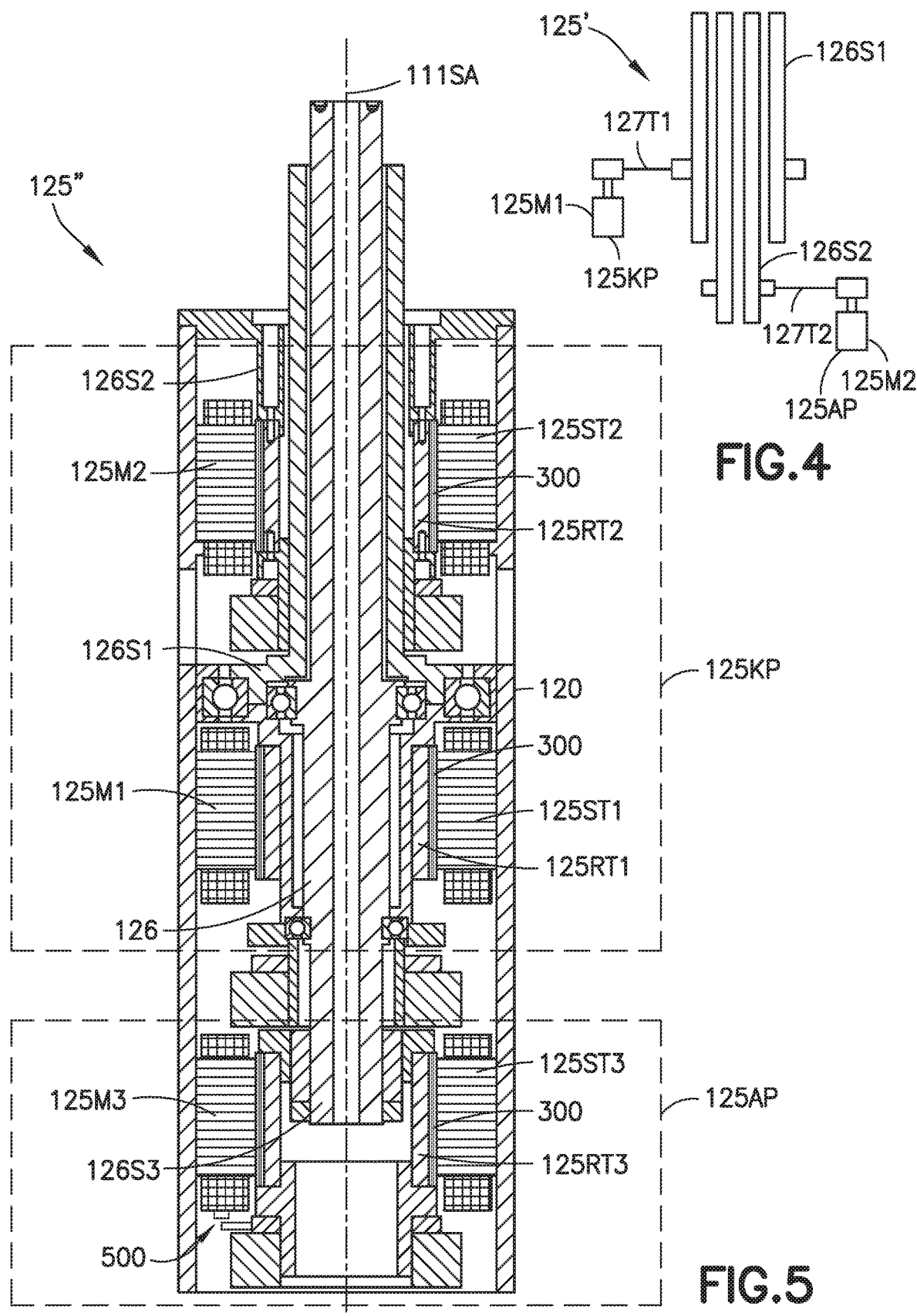

SUBSTRATE TRANSPORT APPARATUS WITH INDEPENDENT ACCESSORY FEEDTHROUGH

CROSS REFERENCE TO RELATED APPLICATIONS

This Non-Provisional Patent Application claims priority to and the benefit of U.S. Provisional Patent Application No. 62/568,541, filed on Oct. 5, 2017, the disclosure of which is incorporated herein by reference in its entirety.

BACKGROUND

1. Field

The exemplary embodiments generally relate to substrate processing apparatus, and more particularly, to substrate transport apparatus.

2. Brief Description of Related Developments

Conventional manufacturing technologies for semiconductor integrated circuits may include processing of silicon wafers, often referred to as substrates, in fully automated vacuum tools. A typical tool may include a cluster vacuum chamber or linear vacuum chamber (both generally referred to as transfer chambers) with load locks and process modules (both generally referred to as stations) connected to the perimeter of the respective transfer chamber. The tool is typically serviced by a vacuum environment substrate transport apparatus which located within the transfer chamber and transports the substrates between, e.g., the load locks and the process modules. The tool may also include an atmospheric section coupled to the transfer chamber. The atmospheric section may include an atmospheric substrate transport apparatus that transports substrates between cassettes (also referred to as stations) and the load locks.

In typical automated substrate handling processes, a substrate is first picked up by the substrate transport apparatus for transfer from station to another station. During transfer, the substrate is subject to displacement/slipping relative to a substrate holder of the substrate transport apparatus. Active/passive grip end effectors are generally employed to mitigate/substantially eliminate slippage. Substrate aligning devices are also employed to determine an amount of slippage/eccentricity of the substrate held by the substrate transport apparatus prior to placement of the substrate at a station. Typically the active grip end effectors and aligners employ a source of power and control to operate, which is provided by vacuum and/or electrical cables fed through arm links of the substrate transport apparatus to the end effector. Flexing of cables due to articulation of the substrate transport apparatus can generate contamination particles, the insulation may give off unwanted gasses in a vacuum, and the cable passages must be adequately sealed to maintain isolation of a controlled atmosphere within the transfer chamber in which the substrate transport apparatus is disposed.

To minimize the length of cable runs and associated problems therewith, some conventional transport apparatus may employ slip rings at articulated joints, which in turn are also subject to particulate contamination generation along slip ring contact surfaces. Furthermore, slip rings are expensive, with a commensurate increase in cost of the substrate transport apparatus. Moreover, the cables and/or conduits providing power and control to the end effector of conventional transport apparatus located in isolatable transfer chambers form physical ties tying the conventional transport apparatus to the otherwise fixed power supply or control source of the transfer chambers.

The addition of active grips and aligners, powered by vacuum and/or electrical feedthroughs, to substrate processing system may help to increase throughput of a substrate processing system but these vacuum and/or electrical feedthroughs may increase the cost, complexity and generation of particles to the substrate processing system.

It would be advantageous to provide a substrate transport apparatus with power accessories to increase substrate handling reliability and/or throughput speed, or to generate power in the substrate transport apparatus without utilizing a vacuum and/or electrical feedthrough extending between an uncontrolled environment and a controlled environment in which the substrate transport apparatus operates.

BRIEF DESCRIPTION OF THE DRAWINGS

The foregoing aspects and other features of the disclosed embodiment are explained in the following description, taken in connection with the accompanying drawings, wherein:

FIGS. 1A-1H are schematic illustrations of substrate processing apparatus configurations incorporating aspects of the disclosed embodiment;

FIGS. 2A-2E are schematic illustrations of substrate transport arms in accordance with aspects of the disclosed embodiment;

FIG. 4 is a schematic illustration of a portion of a substrate transport apparatus in accordance with aspects of the disclosed embodiment;

FIG. 5 is a schematic illustration of a portion of a substrate transport apparatus in accordance with aspects of the disclosed embodiment;

DETAILED DESCRIPTION

Referring to FIGS. 1A-1D, there are shown schematic views of substrate processing apparatus or tools incorporating the aspects of the disclosed embodiment as will be further described herein. Although the aspects of the disclosed embodiment will be described with reference to the drawings, it should be understood that the aspects of the disclosed embodiment can be embodied in many forms. In addition, any suitable size, shape or type of elements or materials could be used.

As will be described in greater detail below, the aspects of the disclosed embodiment provide for a substrate transport apparatus including an independent feedthrough drive for control of accessories mounted to the substrate transport apparatus 100. In the aspects of the disclosed embodiment, electrical power and/or motive power is provided mechanically to one or more accessories mounted/coupled to the substrate transport apparatus 100 without any feedthroughs penetrating through isolation or seal barriers between an external environment and an isolated/closed internal environment of the transfer chamber (such as a vacuum transfer chamber) in which the substrate transport apparatus 100 is located. For example, the drive section 125 of the substrate transport apparatus 100 includes a kinematic portion 125KP and an accessory portion 125AP as will be described below. The accessory portion 125AP provides the electrical power and/or motive power from within the isolated internal environment.

Figure 1A:
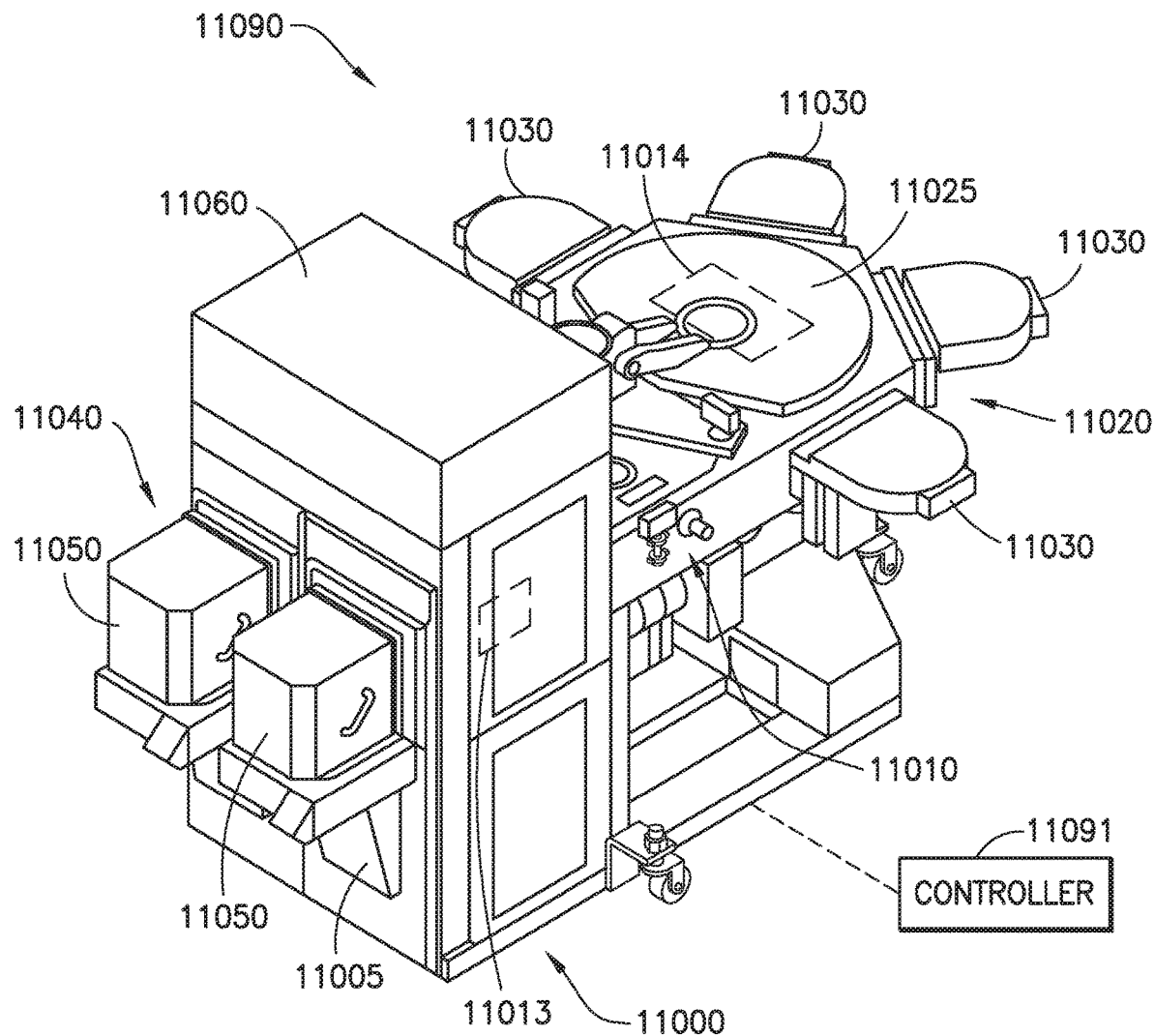
Figure 1B:
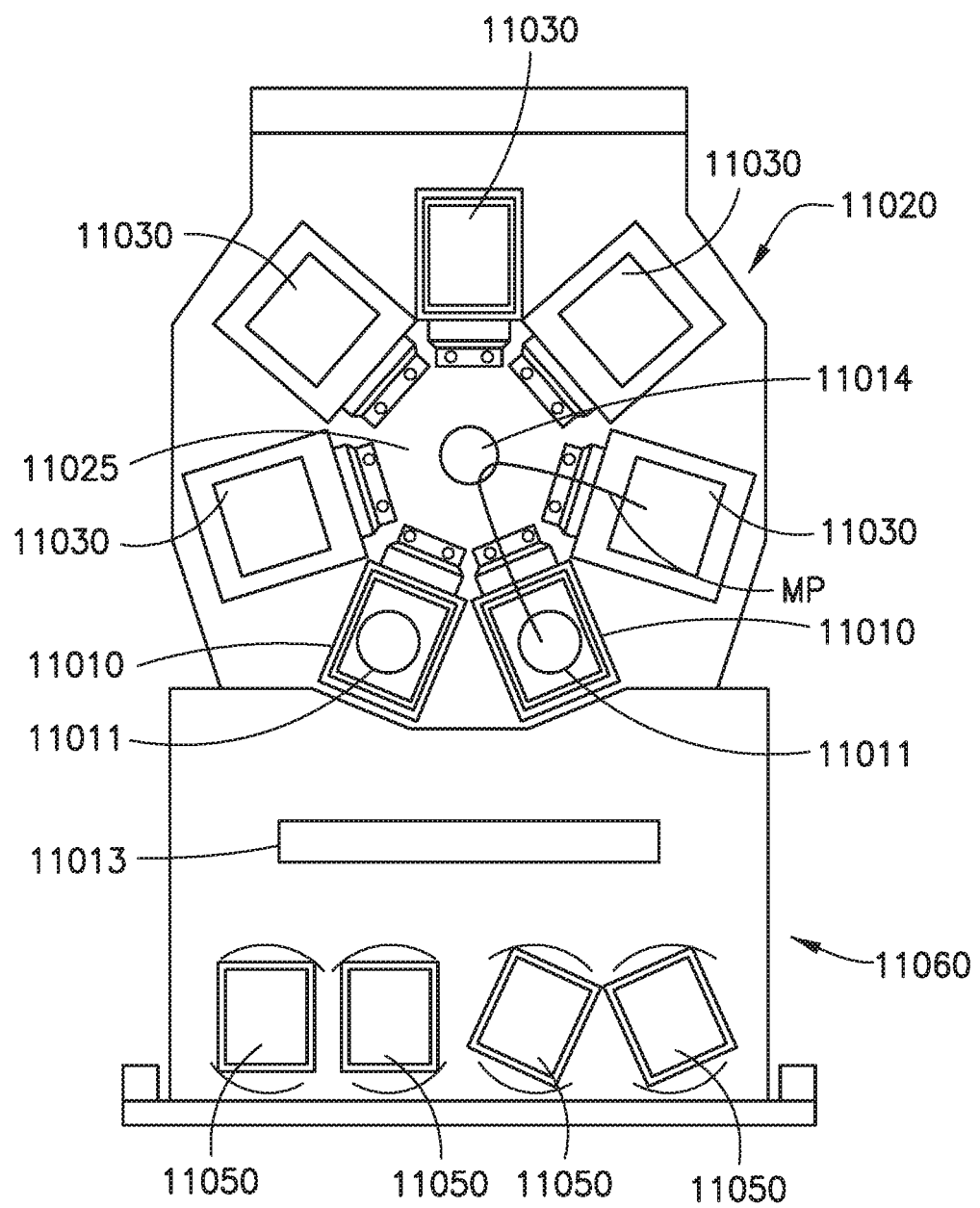

Referring to FIGS. 1A and 1B, a substrate processing apparatus 11090, such as for example a semiconductor tool station is shown in accordance with aspects of the disclosed embodiment. Although a semiconductor tool station is shown in the drawings, the aspects of the disclosed embodiment described herein can be applied to any tool station or application employing robotic manipulators. In this example the semiconductor tool station 11090 is shown as a cluster tool, however the aspects of the disclosed embodiment may be applied to any suitable tool station such as, for example, a linear tool station such as that shown in FIGS. 1C and 1D and described in U.S. Pat. No. 8,398,355, entitled "Linearly Distributed Semiconductor Workpiece Processing Tool," issued Mar. 19, 2013, the disclosure of which is incorporated by reference herein in its entirety.

The semiconductor tool station 11090 generally includes an atmospheric front end 11000, a vacuum load lock 11010 and a vacuum back end 11020. In other aspects, the semiconductor tool station may have any suitable configuration. The components of each of the atmospheric front end 11000, vacuum load lock 11010, and vacuum back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized. The controller 11091 includes any suitable memory and processor(s) that include non-transitory program code for operating the semiconductor tool station 11090 to effect handling of substrates S (see FIG. 1C) as described herein. The controller 11091 is configured to determine the location of the substrate relative to the end effector and/or the substrate holding station to effect picking and placing of the substrates S (FIG. 1C). In one aspect, the controller 11091 is configured to receive detection signals corresponding to one or more features of the end effector and/or transport arm of a substrate transport apparatus/robot and determine the location of the substrate relative to the end effector and/or the substrate holding station to effect picking and placing of the substrates and/or a position of one or more end effector tines.

In one aspect, the atmospheric front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules 11005 may be configured as 200 mm substrate or 450 mm substrate interfaces or any other suitable substrate interfaces such as for example larger or smaller substrates or flat panels for flat panel displays. Although two load port modules 11005 are shown in FIG. 1A, in other aspects any suitable number of load port modules 11005 may be incorporated into the atmospheric front end 11000. The load port modules 11005 may be configured to receive substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. In one aspect the load ports 11040 allow the passage of substrates between the substrate cassettes 11050 and the mini-environment 11060.

In one aspect, the mini-environment 11060 generally includes any suitable substrate transport apparatus 11013 that incorporates one or more aspects of the disclosed embodiment described herein. In one aspect the substrate transport apparatus 11013 may be a track mounted robot such as that described in, for example, U.S. Pat. No. 6,002,840, the disclosure of which is incorporated by reference herein in its entirety or in other aspects, any other suitable substrate transport apparatus 11013 having any suitable configuration. The mini-environment 11060 may provide a controlled, clean zone for substrate transfer between multiple load port modules and the vacuum back end 11020.

The vacuum load lock 11010 may be located between and connected to the mini-environment 11060 and the vacuum back end 11020. It is noted that the term vacuum as used herein may denote a high vacuum such as $10^{-5}$ Torr or below in which the substrates are processed. The vacuum load lock 11010 generally includes atmospheric and vacuum slot valves. The slot valves may provide the environmental isolation employed to evacuate the load lock after loading a substrate from the atmospheric front end 11000 and to maintain the vacuum in the transport chamber when venting the lock with an inert gas such as nitrogen. In one aspect, the load lock 11010 includes an aligner 11011 for aligning a fiducial of the substrate to a desired position for processing. In other aspects, the vacuum load lock 11010 may be located in any suitable location of the substrate processing apparatus 11090 and have any suitable configuration and/or metrology equipment.

The vacuum back end 11020 generally includes a transport chamber 11025, one or more processing station(s) or module(s) 11030 and any suitable transport robot or apparatus 11014. The substrate transport apparatus 11014 will be described below and may be located within the transport chamber 11025 to transport substrates between the vacuum load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa. In one aspect the load port modules 11005 and load ports 11040 are substantially directly coupled to the vacuum back end 11020 so that a cassette 11050 mounted on the load port interfaces substantially directly (e.g. in one aspect at least the mini-environment 11060 is omitted while in other aspects the vacuum load lock 11010 is also omitted such that the cassette 11050 is pumped down to vacuum in a manner similar to that of the vacuum load lock 11010) with a vacuum environment of the transfer chamber 11025 and/or a processing vacuum of a processing station 11030 (e.g. the processing vacuum and/or vacuum environment extends between and is common between the processing station 11030 and the cassette 11050).

Referring now to FIG. 1C, a schematic plan view of a linear substrate processing system 2010 is shown where a tool interface section 2012 is mounted to a transport chamber module 3018 so that the tool interface section 2012 is facing generally towards (e.g. inwards) but is offset from a longitudinal axis LXA of the transport chamber module 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3018A, 3018I, 3018J includes any suitable substrate transport 2080, which may include one or more aspects of the disclosed embodiment described herein, for transporting substrates S throughout the linear substrate processing system 2010 and into and out of, for example, processing modules PM (which in one aspect are substantially similar to processing stations 11030 described above). As may be realized, each transport chamber module 3018, 3018A, 3018I, 3018J may be capable of holding an isolated or controlled atmosphere (e.g. N2, clean air, vacuum).

Figure 1D:
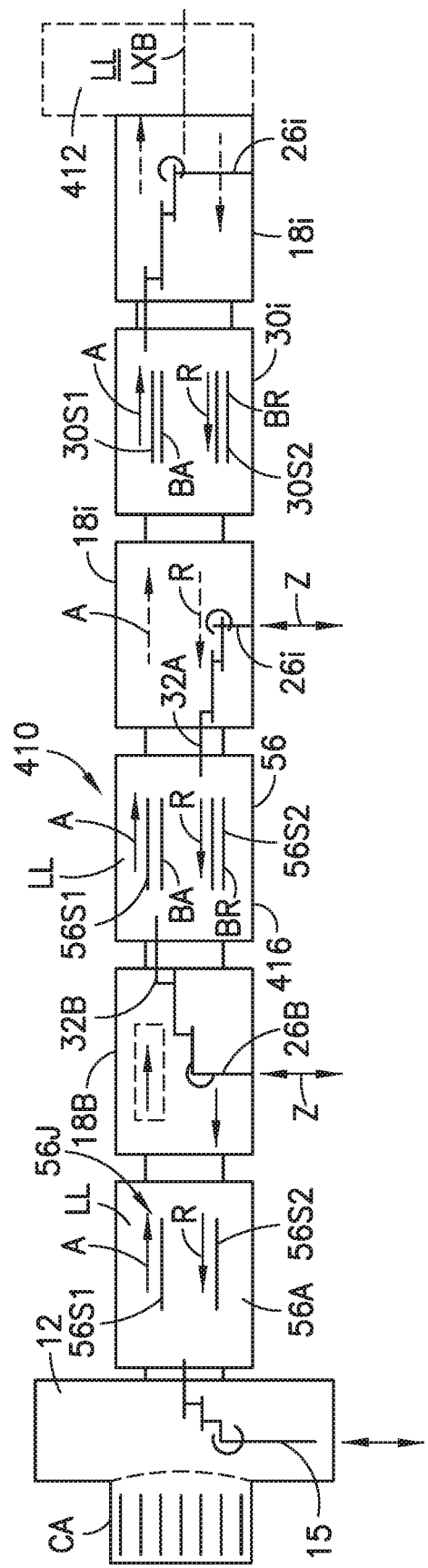

Referring to FIG. 1D, there is shown a schematic elevation view of an exemplary processing tool 410 such as may be taken along longitudinal axis LXB of a linear transport chamber 416. In the aspect of the disclosed embodiment shown in FIG. 1D, tool interface section 12 may be representatively connected to the linear transport chamber 416. In this aspect, tool interface section 12 may define one end of the linear transport chamber 416. As seen in FIG. 1D, the linear transport chamber 416 may have another substrate entry/exit station 412 for example at an opposite end from tool interface station 12. In other aspects, other entry/exit stations for inserting/removing substrates from the linear transport chamber 416 may be provided. In one aspect, tool interface section 12 and entry/exit station 412 may allow loading and unloading of substrates from the processing tool 410. In other aspects, substrate may be loaded into the processing tool 410 from one end and removed from the other end. In one aspect, the linear transport chamber 416 may have one or more transfer chamber module(s) 18B, 18i. Each transfer chamber module 18B, 18i may be capable of holding an isolated or controlled atmosphere (e.g. N2, clean air, vacuum). As noted before, the configuration/arrangement of the transport chamber modules 18B, 18i, load lock modules 56A, 56 and substrate stations forming the linear transport chamber 416 shown in FIG. 1D is merely exemplary, and in other aspects the transport chamber may have more or fewer modules disposed in any desired modular arrangement. In the aspect shown, substrate entry/exit station 412 may be a load lock. In other aspects, a load lock module may be located between the end entry/exit station (similar to station 412) or the adjoining transport chamber module (similar to module 18i) may be configured to operate as a load lock.

Figure 2A:
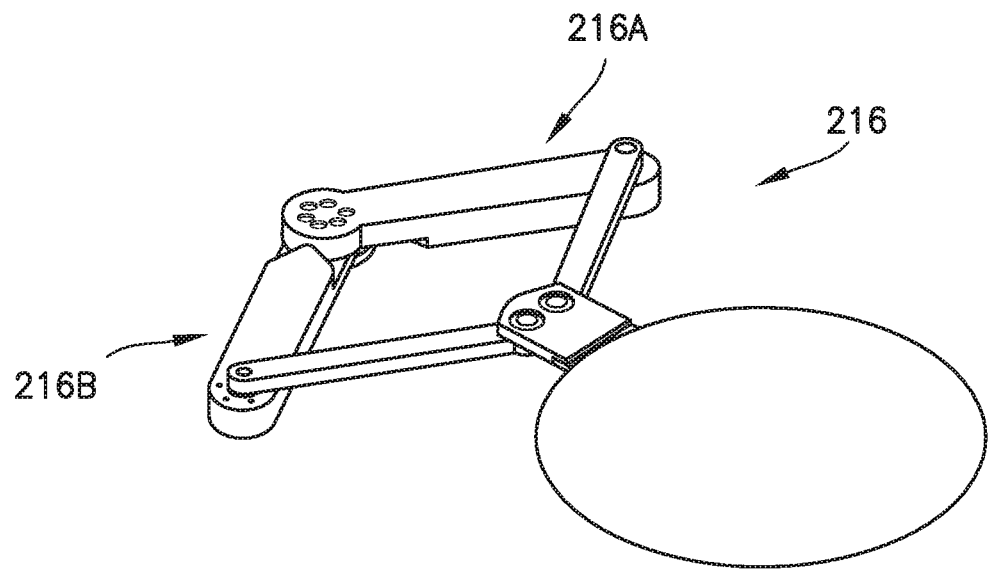
Figure 2B:
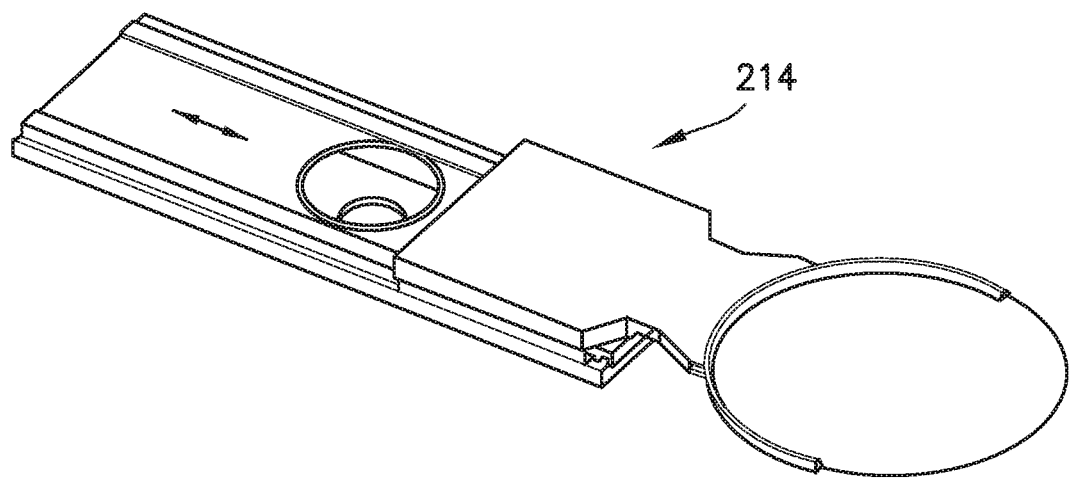

As also noted before, transport chamber modules 18B, 18i have one or more corresponding substrate transport apparatus 26B, 26i, which may include one or more aspects of the disclosed embodiment described herein, located therein. The substrate transport apparatus 26B, 26i of the respective transport chamber modules 18B, 18i may cooperate to provide the linearly distributed substrate transport system in the linear transport chamber 416. In this aspect, the substrate transport apparatus 26B, 26i (which may be substantially similar to the substrate transport apparatus 11013, 11014 of the cluster tool illustrated in FIGS. 1A and 1B) may have a general SCARA arm configuration (though in other aspects the substrate transport apparatus may have any other desired arrangement such as, for example, a linearly sliding arm 214 as shown in FIG. 2B or other suitable arms having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties.

Figure 2C:
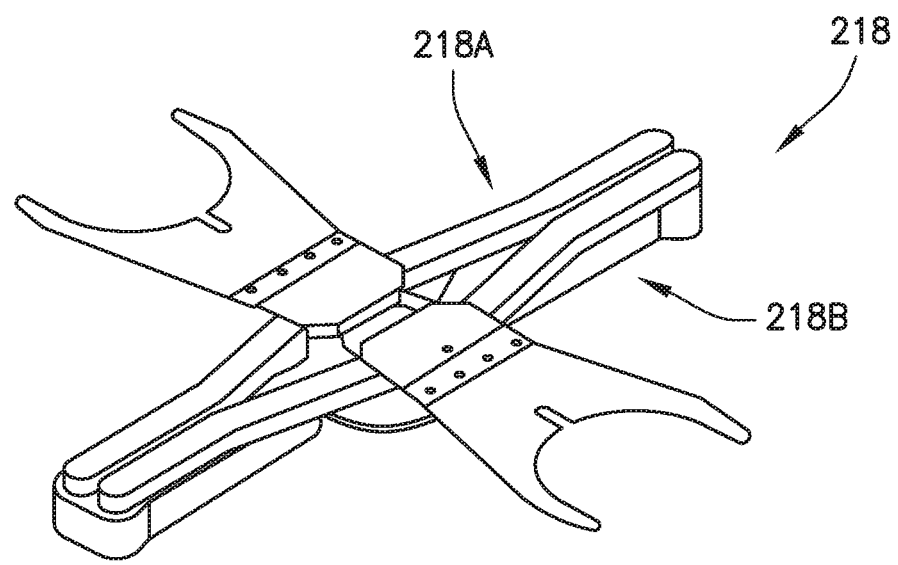
Figure 2D:
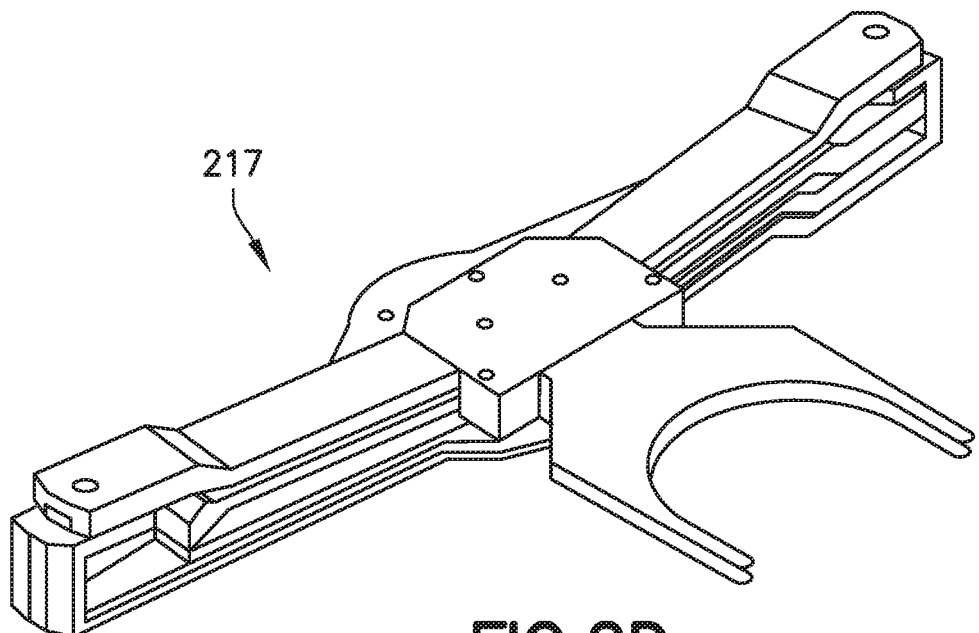

In aspects of the disclosed embodiment, the at least one substrate transport apparatus may have a general configuration known as SCARA (selective compliant articulated robot arm) type design, which includes an upper arm, a forearm and an end-effector, or from a telescoping arm or any other suitable arm design. In one aspect, the arm may have a band-driven configuration, a continuous loop configuration, or any other suitable configuration as will be described further below. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. The SCARA arm(s) may have one link, two links, or any suitable number of links and may have any suitable drive pulley arrangement such as a 2:1 shoulder pulley to elbow pulley arrangement and a 1:2 elbow pulley to wrist pulley arrangement. In still other aspects the substrate transport apparatus may have any other desired arrangement such as a frog-leg arm 216 (FIG. 2A) configuration, a leap frog arm 217 (FIG. 2D) configuration, a bi-symmetric arm 218 (FIG. 2C) configuration, or any other suitable configuration.

In another aspect, referring to FIG. 2E, the transfer arm 219 includes at least a first and second articulated arm 219A, 219B where each arm 219A, 219B includes an end effector 219E configured to hold at least two substrates S1, S2 side by side in a common transfer plane (each substrate holding location of the end effector 219E shares a common drive for picking and placing the substrates S1, S2) where the spacing DX between the substrates S1, S2 corresponds to a fixed spacing between side by side substrate holding locations. Suitable examples of substrate transport apparatus can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties. The aspects of the disclosed embodiment are, in one aspect, incorporated into the substrate transport apparatus of a linear transport shuttle such as those described in, for example, U.S. Pat. Nos. 8,293,066 and 7,988,398 the disclosures of which are incorporated herein by reference in their entireties.

In the aspect of the disclosed embodiment shown in FIG. 1D, the arms of the substrate transport apparatus 26B, 26i may be arranged to provide what may be referred to as fast swap arrangement allowing the transport to quickly swap substrates (e.g. pick a substrate from a substrate holding location and then immediately place a substrate to the same substrate holding location) from a pick/place location. The substrate transport apparatus 26B, 26i may have any suitable drive section (e.g. coaxially arranged drive shafts, side by side drive shafts, horizontally adjacent motors, vertically stacked motors), for providing each arm with kinematic motion in any suitable number (N) of degrees of freedom (DOF) (e.g. manifested as independent axis of motion (such as $R_i$, $\Phi_i$) of the arm links (e.g., upper/forearm) and independent axis of motion of each end effector of the arm 110, and defined by each independent axis of rotation of each arm link (upper, forearm, end effector) about its corresponding support joint). As seen in FIG. 1D, in this aspect the modules 56A, 56, 30i may be located interstitially between transfer chamber modules 18B, 18i and may define suitable processing modules, load lock(s) LL, buffer station(s), metrology station(s) or any other desired station(s). For example the interstitial modules, such as load locks 56A, 56 and substrate station 30i, may each have stationary substrate supports/shelves 56S1, 56S2, 30S1, 30S2 that may cooperate with the substrate transport apparatus to effect transport or substrates through the length of the linear transport chamber 416 along longitudinal axis LXB of the linear transport chamber 416.

By way of example, substrate(s) may be loaded into the linear transport chamber 416 by tool interface section 12. The substrate(s) may be positioned on the support(s) of load lock module 56A with the transport arm 15 of the interface section. The substrate(s), in load lock module 56A, may be moved between load lock module 56A and load lock module 56 by the substrate transport apparatus 26B in module 18B, and in a similar and consecutive manner between load lock 56 and substrate station 30i with substrate transport apparatus 26i (in module 18i) and between station 30i and station 412 with substrate transport apparatus 26i in module 18i. This process may be reversed in whole or in part to move the substrate(s) in the opposite direction. Thus, in one aspect, substrates may be moved in any direction along longitudinal axis LXB and to any position along the transport chamber 416 and may be loaded to and unloaded from any desired module (processing or otherwise) communicating with the transport chamber 416. In other aspects, interstitial transport chamber modules with static substrate supports or shelves may not be provided between transport chamber modules 18B, 18i. In such aspects, transport arms of adjoining transport chamber modules may pass off substrates directly from end effector or one transport arm to end effector of another transport arm to move the substrate through the transport chamber 416.

The processing station modules may operate on the substrates through various deposition, etching, or other types of processes to form electrical circuitry or other desired structure on the substrates. The processing station modules are connected to the transport chamber modules to allow substrates to be passed from the transport chamber 416 to the processing stations and vice versa. A suitable example of a processing tool with similar general features to the processing apparatus depicted in FIG. 1D is described in U.S. Pat. No. 8,398,355, previously incorporated by reference in its entirety.

Figure 1E:
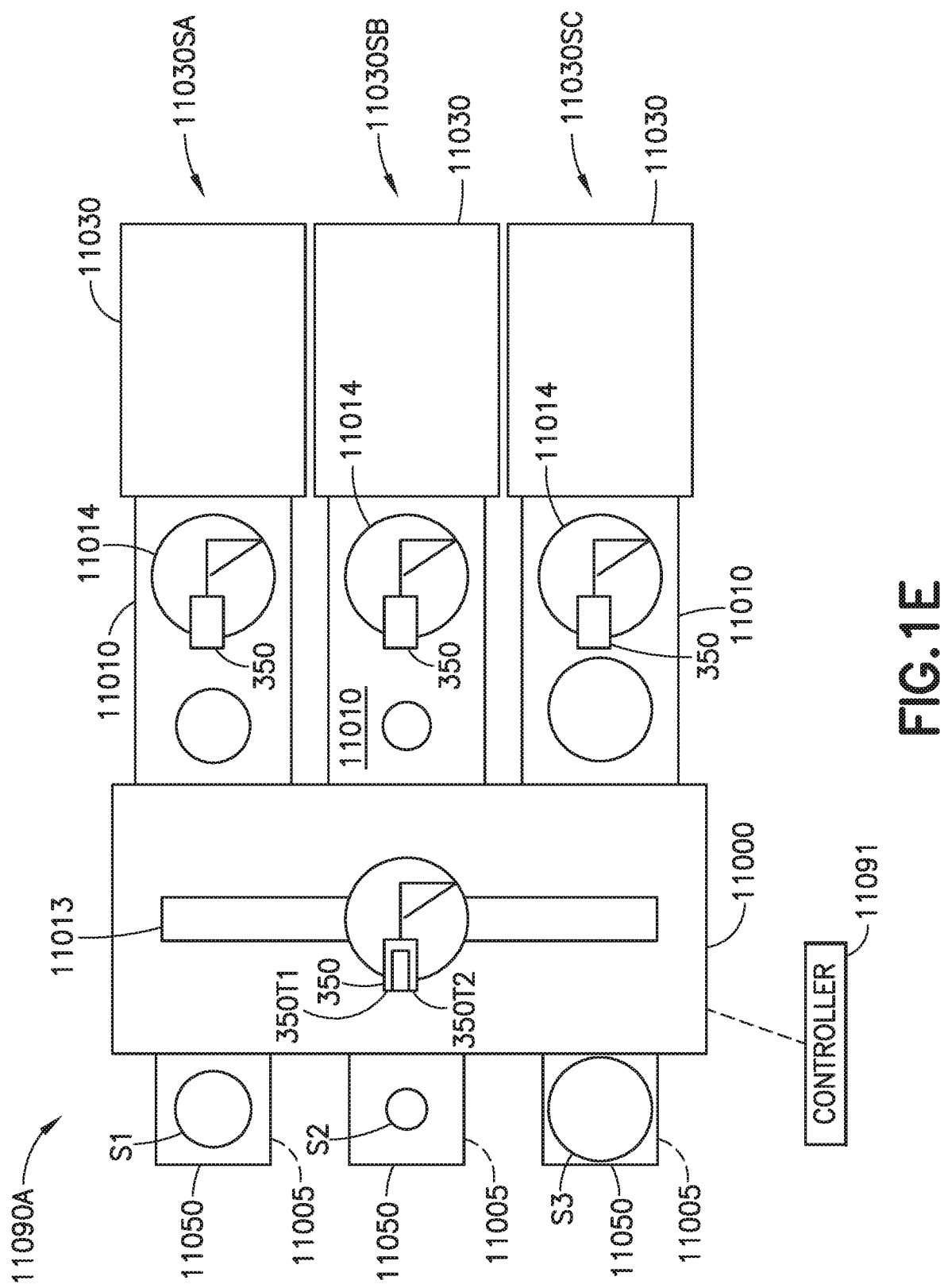

FIG. 1E is a schematic illustration of a semiconductor tool station 11090A which may be substantially similar to the semiconductor tool stations described above. Here, the semiconductor tool station 11090A includes separate/distinct in-line processing sections 11030SA, 11030SB, 11030SC connected to a common atmospheric front end 11000. In this aspect, at least one of the in-line processing sections 11030SA, 11030SB, 11030SC is configured to process a substrate S1, S2, S3 that has a different predetermined characteristic than the substrates processed in the other in-line processing sections 11030SA, 11030SB, 11030SC. For example, the predetermined characteristic may be a size of the substrate. In one aspect, for exemplary purposes only, in-line processing section 11030SA may be configured to process 200 mm diameter substrates, in-line processing section 11030SB may be configured to process 150 mm substrates, and in-line processing section 11030SC may be configured to process 300 mm substrates. In one aspect, at least one of the substrate transport apparatus 11013, 11014 is configured to transport the different sized substrates S1, S2, S3 with a common end effector. In one aspect, each of the load port modules 11050 may be configured to hold and interface with, on a common load port module, cassettes 11050 which hold different size substrates S1, S2, S3. In other aspects, each load port module 11050 may be configured to hold a predetermined cassette corresponding to a predetermined sized substrate. Processing substrates of different sizes with at least one common substrate transport apparatus 11013, 11014 may increase throughput and decrease machine down time with respect to single substrate batch processing.

FIG. 1F is a schematic illustration of a semiconductor tool station 11090B substantially similar to semiconductor tool station 11090. However, in this aspect, the process modules 11030 and load port modules 11005 are configured to process substrates having different sizes as described above with respect to semiconductor tool station 11090A. In this aspect, the process modules 11030 may be configured to process substrates having different sizes or in other aspects, process modules may be provided that correspond to the different size substrates being processed in the semiconductor tool station 11090B.

Figure 1G:
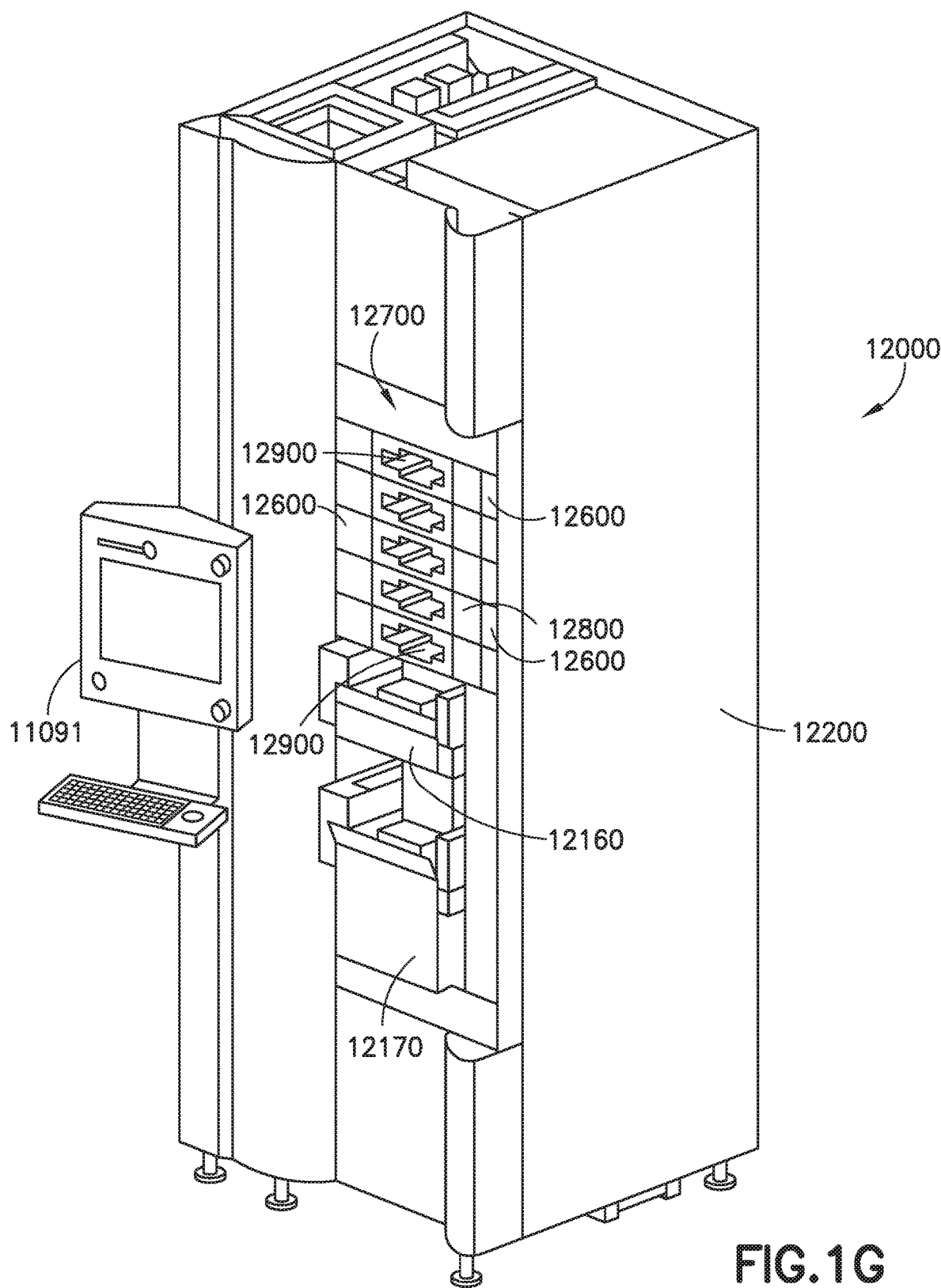
Figure 1H:
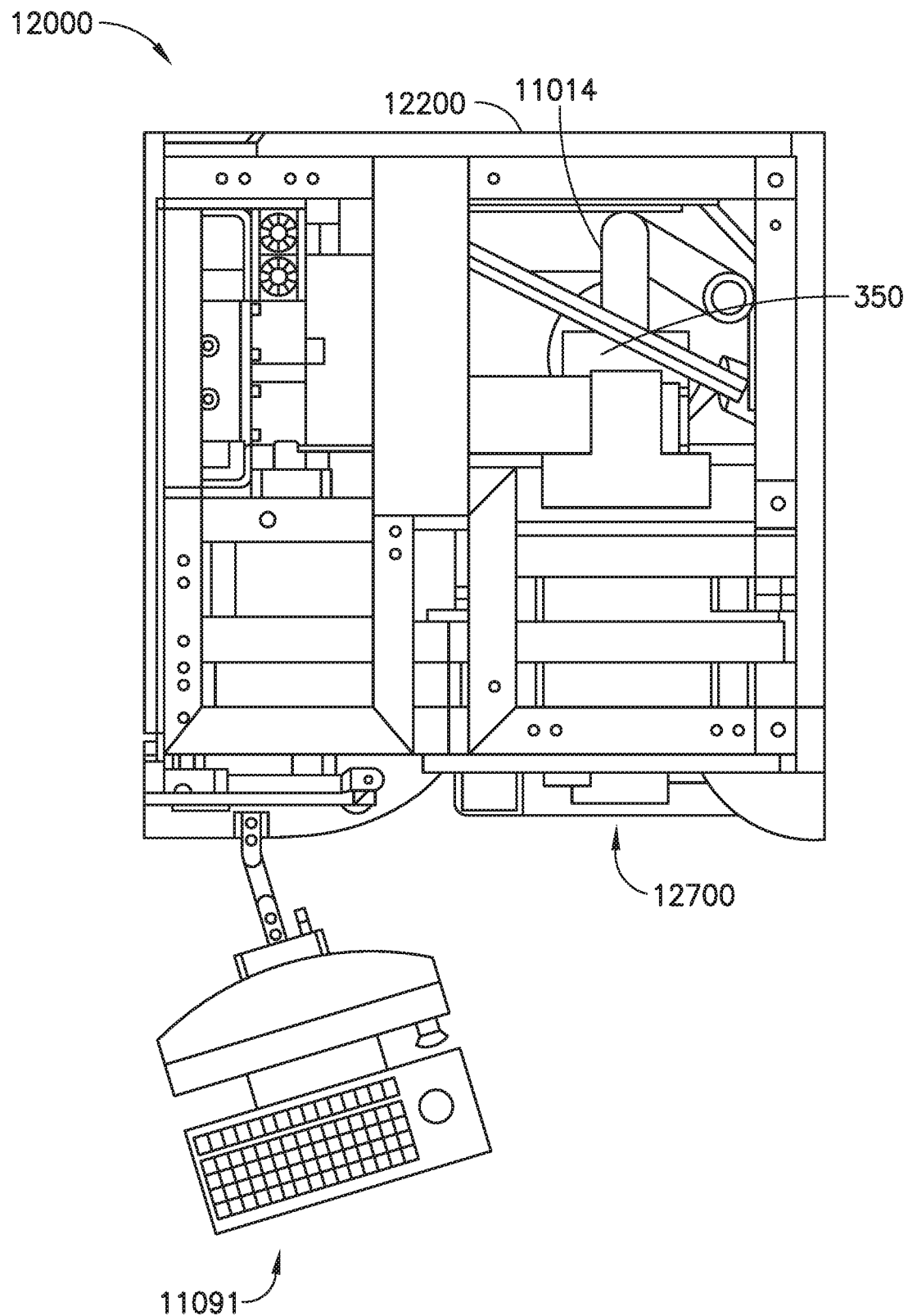

Referring to FIGS. 1G and 1H, the aspects of the disclosed embodiment may be incorporated into sorting machines and/or stockers. In one aspect, the sorting machines and/or stockers may be used to sort or stock substrates (such as those described above). As an example, FIGS. 1G and 1H illustrate a manipulating device 12000 substantially similar to that described in U.S. Pat. No. 7,699,573 issued on Apr. 20, 2010, the disclosure of which is incorporated herein by reference in its entirety. Here the manipulating device 12000 may be configured to manipulate substrates such as reticles but in other aspects the manipulating device 12000 may be configured to manipulate any suitable substrate. The manipulating device 12000 may be a modular device having a housing 12200 for maintaining clean a room environment within the housing 12200. The manipulating device 12000 includes an input/output station 12700 integrated into the housing 12200 that includes panels 12600. Each panel 12600 belongs to an input/output unit 12800 which is also modular. One edge of an opening 12900 of the respective panel 12600 is provided with a contour that corresponds at least approximately to the outer contour of each type of substrate (such as e.g. a reticle transport box) that is to be processed by the manipulating device 12000. The openings 12900 are configured so that the substrates can be input/output through the openings 12900 to and from the manipulating device 12000. In one aspect, the manipulating device 12000 also includes drawers 12170, 12160 that are components of additional input/output units 12800 of input/output station 12700. The drawers 12170, 12160 may have different structural height and can be pulled out to accept larger transport boxes, for example, those which can accommodate more than one substrate, i.e. the larger transport boxes can be introduced into the manipulating device 12000 through the drawers 12160, 12170. The manipulating device 12000 also includes at least one substrate transport apparatus 11014 substantially similar to those described herein. The at least one substrate transport apparatus 11014 is configured to transport the one or more substrates within the manipulating device 12000 for sorting, stocking or for any other processing operation(s). It is noted that the configuration of the manipulating device 12000 described herein is exemplary and in other aspects, the manipulating device 12000 may have any suitable configuration for sorting and/or stocking substrates in any suitable manner.

In one aspect, the manipulating device 12000 may be included in the semiconductor tool stations of FIGS. 1A-1F described above. For example, in one aspect, the manipulating device 12000 may be incorporated in the atmospheric front end 11000 of the semiconductor tool stations/systems 11090, 2010, 11090A, 11090B as a load port and/or atmospheric transfer chamber; while in other aspects the manipulating device 12000 may be incorporated in the vacuum back end 11020 of the semiconductor tool stations/systems 11090, 2010, 11090A, 11090B as a process module and/or a transfer chamber. In one aspect, the manipulating device 12000 may be coupled to the atmospheric front end 11000 in place of the vacuum back end 11020. As may be realized, manipulating device 12000 incorporating aspects of the disclosed embodiment could store a multitude of different shaped and/or sized substrates in a common housing using a common end effector.

Figure 3:
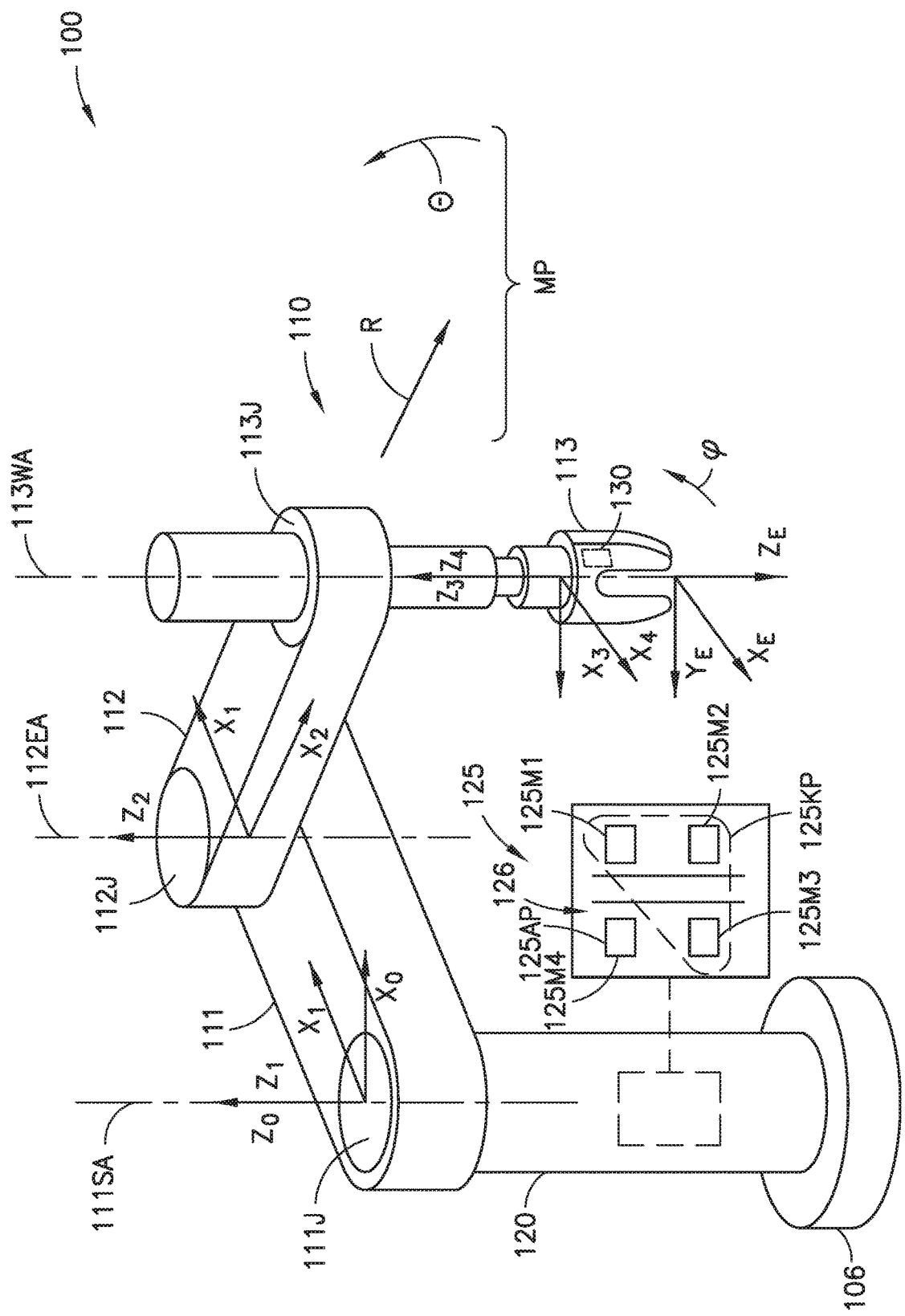
FIG. 3 is a schematic illustration of a substrate transport apparatus in accordance with aspects of the disclosed embodiment.
Figure 3A:
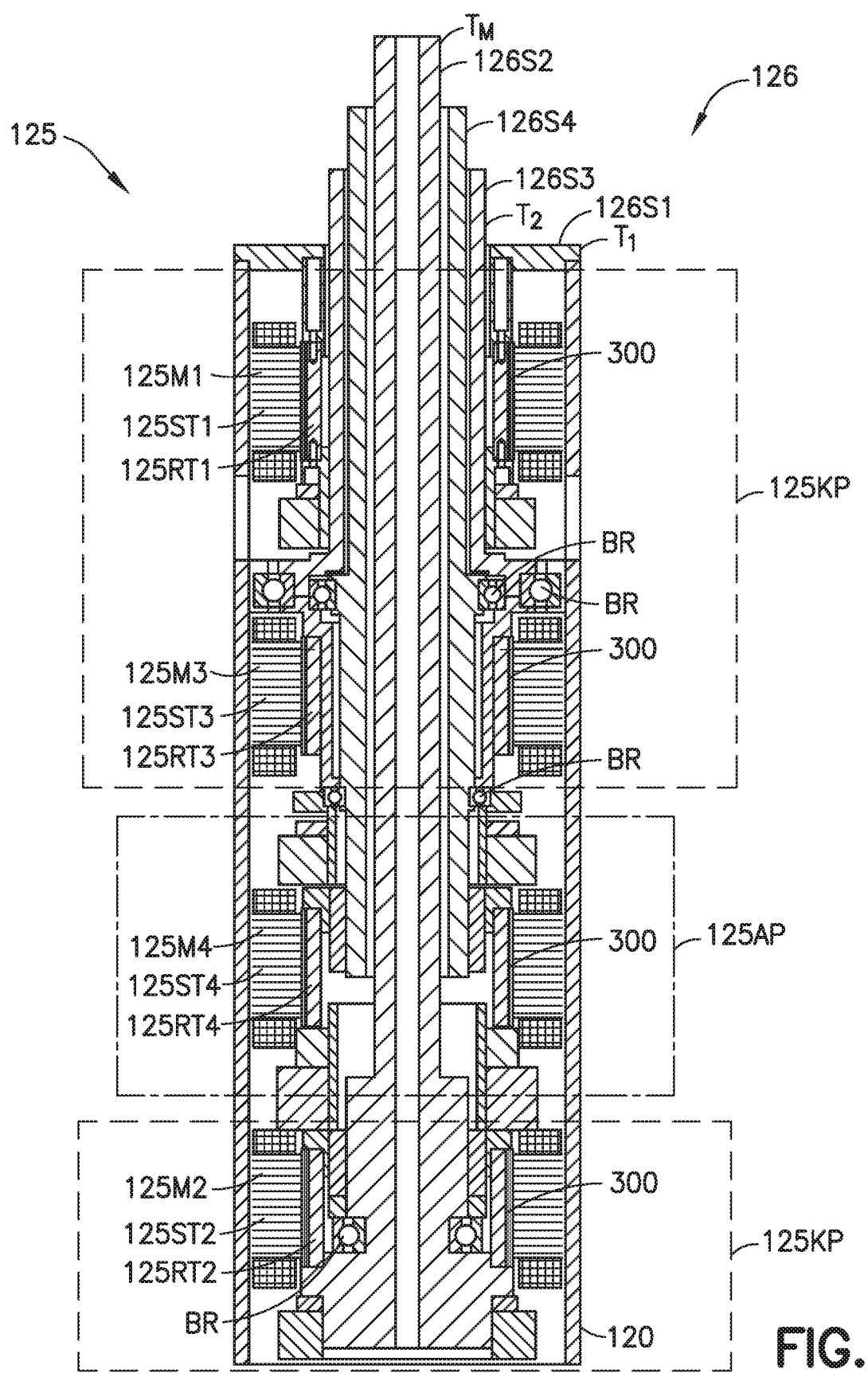
FIG. 3A is a schematic illustration of a portion of a substrate transport apparatus in accordance with aspects of the disclosed embodiment.

Referring now to FIGS. 3 and 3A, an exemplary substrate transport apparatus 100 is illustrated in accordance with aspects of the disclosed embodiment. The substrate transport apparatus 100 is substantially similar to the substrate transport apparatus described above with respect to FIGS. 1A-1H and may include one or more of the arm configurations described above with respect to FIGS. 2A-2E. The substrate transport apparatus 100 may be employed in any suitable atmospheric or vacuum environment such as those described above with respect to the semiconductor tool stations. As can be seen in FIG. 3, in one aspect the substrate transport apparatus 100 includes a frame 106, at least one substrate transport arm 110 and a base/housing 120 mounted to the frame 106 and coupled to the substrate transport arm 110. In one aspect, the base 120 includes a drive section 125 disposed therein and coupled to the substrate transport arm 110. Any suitable controller, such as controller 11091 described above, may be connected to the drive section 125 and includes any suitable program code for effecting operation of the substrate transport apparatus 100 as described herein.

In one aspect, the drive section 125 is a four axis drive section while in other aspects the drive section 125 may include any suitable number of drive axes, e.g., two, three, or more than four axes. In one aspect, the drive section 125 generally comprises a coaxial drive shaft assembly 126 and more than one motor 125M1-125M4. As may be realized the more than one motor 125M1-125M4, may have any suitable arrangement, such as horizontally adjacent, vertically stacked, or any other suitable arrangement (as will be described herein) and may be located in a common housing (i.e., base/housing 120). It is also noted that the drive motors described herein may be permanent magnet motors, variable reluctance motors (having at least one salient pole with corresponding coil units and at least one respective rotor having at least one salient pole of magnetic permeable material), or any other suitable drive motors.

As illustrated in FIG. 3A, the drive section 125 is shown in accordance with an aspect of the disclosed embodiment. In this aspect, the drive section 125 has a coaxial drive arrangement, however other aspects may have any suitable drive arrangement. In this aspect, the drive section 125 is disposed in a common housing 120, at least partially housing the drive shaft assembly 126 where the drive section 125 includes four drive shafts 126S1-126S4 and four motors 125M1-125M4. Although the drive section 125 of the substrate transport apparatus 100 is illustrated in FIGS. 3 and 3A as having four motors and four drive shafts, other exemplary drive section configurations depicted in FIGS. 4-7 may have any suitable number of motors and drive shafts and any suitable configuration.

For example, drive section 125', illustrated in FIG. 4, includes a two motor off axis configuration such that two drive shafts 126S1, 126S2 are arranged coaxially and two motors 125M1, 125M2 are arranged staggered/off axis from the coaxial drive shafts 126S1, 126S2. In this aspect, any suitable transmissions 127T1, 127T2 couple the motors 125M1, 125M2 to the respective drive shafts 126S1, 126S2. Drive section 125", illustrated in FIG. 5, includes a three motor coaxial configuration such that three drive shafts 126S1-126S3 are arranged coaxially and three motors 125M1-125M3 are vertically stacked in a coaxial arrangement. Drive section 125'", illustrated in FIG. 6, includes a four motor nested or concentric configuration such that four drive shafts 126S1-126S4 are arranged coaxially and four motors 125M1-125M4 are arranged in a nested coaxial arrangement. For example, motor 125M2 is nested within (e.g., is radially surrounded by) motor 125M1 and motor 125M3 is nested within motor 125M4. The nested motors 125M1, 125M2 are coaxially arranged relative to nested motors 125M3, 125M4 so that nested motors 125M1, 125M2 are disposed coaxially above nested motors 125M3, 125M4. Drive section 125"", illustrated in FIG. 7, includes three coaxial drive shafts 126S1-126S3 and three motors 125M1-125M3. Two of the motors 125M1, 125M2 are in the manner described above with respect to FIG. 6 and are stacked above or below the third motor 125M3. It is noted that in the motor configurations depicted in, e.g., FIGS. 6 and 7 having nested motors stacked one above the other along a vertical axis at different levels L1, L2, the different levels of the motors are less than an independent number of degrees of freedom defined by the motors and the drive/motor assembly is disposed within the semiconductor tool station relative to the arm(s) 110 so that the arm(s) 100 is disposed at a predetermined standard height H above the floor. Other suitable examples of drive section arrangements are described in U.S. Pat. Nos. 6,485,250, 5,720,590, 5,899,658 and 5,813,823 while other suitable examples of drive system arrangements include those described in U.S. patent application Ser. No. 12/163,996 entitled "Robot Drive with Magnetic Spindle Bearings" and filed on Jun. 27, 2008, the disclosure of which is incorporated herein by reference in its entirety.

Referring again to FIG. 3A, the first motor 125M1 of the drive section 125 includes a stator 125ST1 and a rotor 125RT1 connected to the outer drive shaft 126S1. The second motor 125M2 of the drive section 125 includes a stator 125ST2 and a rotor 125RT2 connected to inner drive shaft 126S2. The third motor 125M3 of the drive section 125 includes a stator 125ST3 and a rotor 125RT3 connected to drive shaft 126S3. The fourth motor 125M4 of the drive section 125 includes a stator 125ST4 and a rotor 125RT4 connected to the fourth drive shaft 126S4. The four stators 125ST1-125ST4 of the four motors 125M1-125M4 are stationarily attached to the common housing 120 at different vertical heights or locations within the common housing 120. Although the motors 125M1-125M4 are illustrated with motor 125M1 being at a top portion of the common housing 120 followed by motor 125M3 directly below motor 125M1, motor 125M4 directly below motor 125M3, and motor 125M2 being at a bottom portion of the common housing 120, any suitable arrangement of the motors 125M1-125M4 may be utilized for driving the respective drive shafts 126S1-126S4.

In one aspect, the stator(s) 125ST1-125ST4 of the four motors 125M1-125M4 may be located in an "external" or "non-sealed" environment that is sealed from an atmosphere in which the substrate transport arm 110 operates (the atmosphere in which the substrate transport arm operates is referred to herein as a "sealed" environment which may be a vacuum or any other suitable environment) through the employment of any suitable isolation wall or barrier 300 while the rotor(s) 125RT1-125RT4 are located within the sealed environment. It is noted that the term "isolation wall" as used herein may refer to a wall made of any suitable non-ferromagnetic material that may be disposed between the moving parts of the drive section and/or sensors (associated with the drive) and the corresponding stationary parts of the drive section and/or sensors. In one aspect, the barrier 300 may be a "can-seal" being one substantially continuous seal common to the motors 125M1-125M4 of the drive section 125 to isolate a motor rotor from a corresponding motor stator via a hermetically sealed non-magnetic wall. A suitable example of a "can-seal" can be found in, for example, U.S. application Ser. No. 14/540,072 filed Nov. 13, 2014 and titled "Sealed Robot Drive". It should be realized that the isolation wall or barrier 300 need not be provided if the substrate transport apparatus 100 is only intended for use in an atmospheric environment, such as within the atmospheric front end 11000 of the substrate processing apparatus 11090 (FIG. 1). As noted above, each of the rotors 125RT1-125RT4 of the motors 125M1-125M4 are connected to a respective drive shaft 126S1-126S4 and generally comprise permanent magnets, but may alternatively comprise a magnetic induction rotor that does not have permanent magnets.

In one aspect, the drive shafts 126S1-126S4 may be mechanically supported within the common housing/base 120 by any suitable bearings BR. In other aspects, the drive shafts 126S1-126S4 may be magnetically suspended (e.g. substantially without contact), e.g., within the base 120 in any suitable manner such as described in U.S. Pat. No. 8,283,813 entitled "Robot Drive with Magnetic Spindle Bearings" issued on Oct. 9, 2012 and U.S. Pat. No. 8,008,884 entitled "Substrate Processing Apparatus with Motors Integral to Chamber Walls" issued on Aug. 30, 2011, the disclosures of which are incorporated by reference herein in their entireties. Each drive shaft 126S1-126S4 of the drive section 125 is driven by its respective motor 125M1-125M4, as will be further described below.

Still referring to FIGS. 3 and 3A, in one aspect, the drive section 125 includes a kinematic portion 125KP and an accessory portion 125AP. For example, at least one of the more than one motor 125M1-125M4 defines the kinematic portion 125KP of the drive section 125 (e.g., motors 125M1-125M3 define the kinematic portion 125KP in FIGS. 3 and 3A) and at least another of the more than one motor 125M1-125M4 defines the accessory portion 125AP of the drive section 125 (e.g., motor 125M4 defines the accessory portion 125AP in FIGS. 3 and 3A). The accessory portion 125AP is located adjacent the kinematic portion 125KP, for example, in the base 120. Although the kinematic portion 125KP and accessory portion 125AP are depicted as being located in the base 120, the kinematic portion 125KP and accessory portion 125AP may be located adjacent one another on a shoulder joint 111J, elbow joint 112J, or any other suitable location of the substrate transport apparatus 100, such as within an upper arm link 111 or forearm link 112.

As may be realized, the kinematic portion 125KP may include N number of motors of the more than one motor 125M1-125M4 while the accessory portion 125AP includes at least another motor of the more than one motor 125M1-125M4, different and distinct from the N number of motors of the kinematic portion 125KP. For example, in a drive section having two motors 125M1, 125M2, such as the drive section 125' illustrated in FIG. 4, the N number of motors is one motor (e.g., motor 125M1), such that the kinematic portion 125KP includes one of the two motors 125M1, 125M2 while the other motor (e.g., 125M2) of the two motors 125M1, 125M2 defines the accessory portion 125AP. In another example, in a drive section having three motors 125M1-125M3, such as drive sections 125" and 125"" illustrated in FIGS. 5 and 7, the N number of motors is two motors (e.g., 125M1, 125M2), such that the kinematic portion 125KP includes two of the three motors 125M1-125M3 while the other motor (e.g., 125M3) of the three motors 125M1-125M3 defines the accessory portion 125AP.

Figure 6:
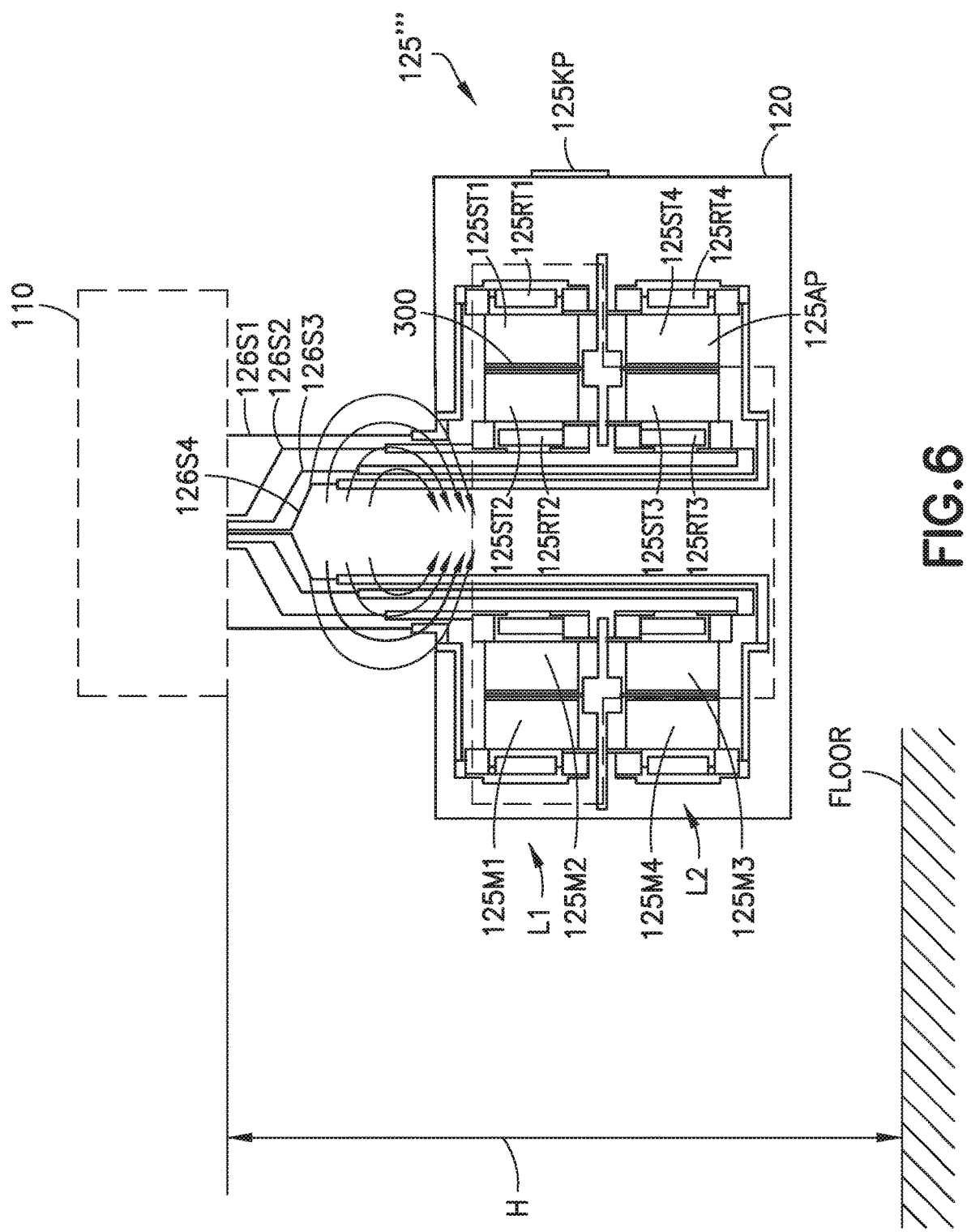
FIG. 6 is a schematic illustration of a portion of a substrate transport apparatus in accordance with aspects of the disclosed embodiment.
Figure 7:
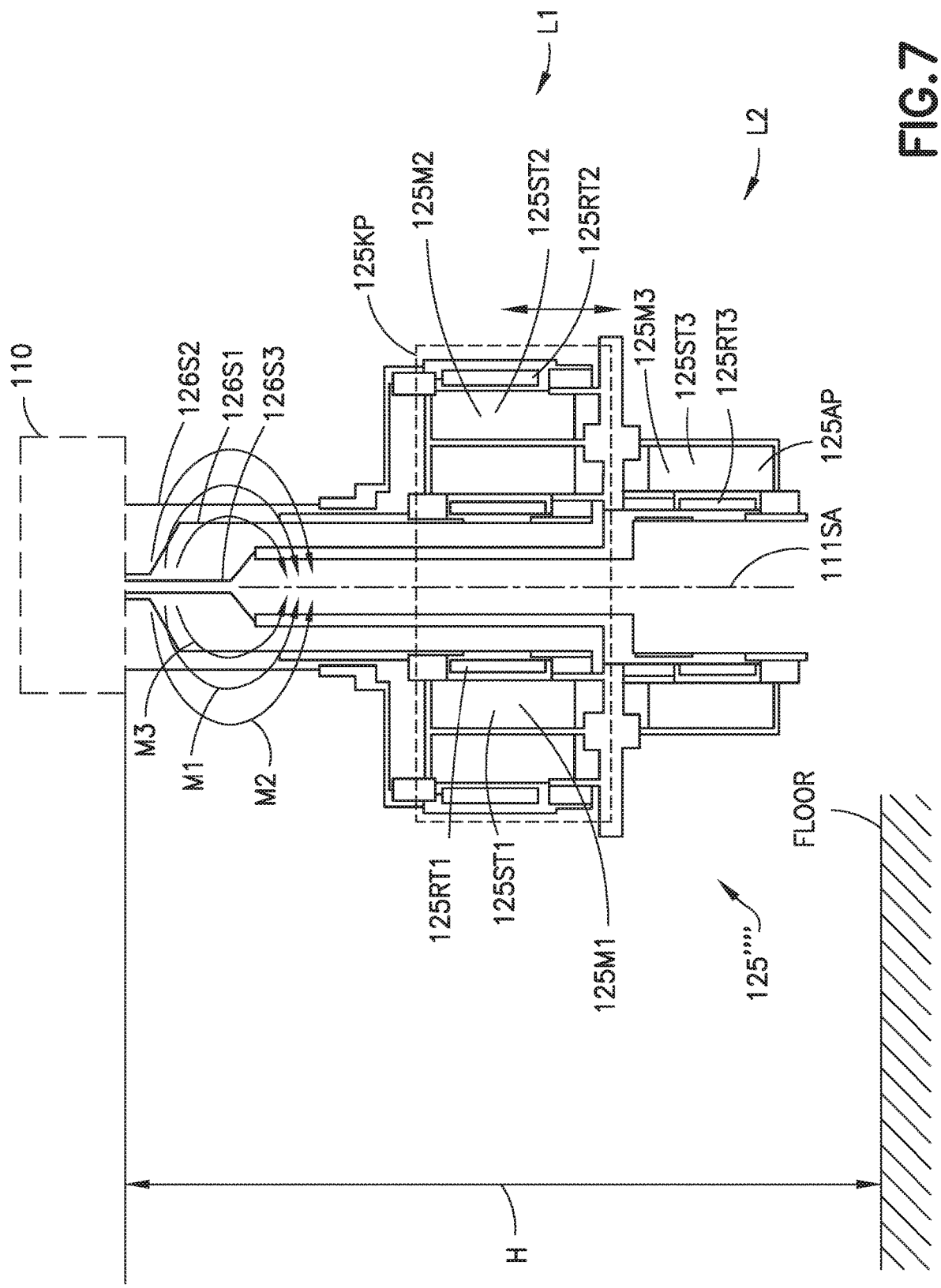
FIG. 7 is a schematic illustration of a portion of a substrate transport apparatus in accordance with aspects of the disclosed embodiment.

In another example, in a drive section having four motors 125M1-125M4, such as drive sections 125 and 125''' illustrated in FIGS. 3A and 6, the N number of motors is three motors (e.g., 125M1-125M3), such that the kinematic portion 125KP includes three of the four motors 125M1-125M4 while the other motor (e.g., 125M4) of the four motors 125M1-125M4 defines the accessory portion 125AP. Generally, each of the N number of motors of the kinematic portion 125KP are provided to independently (alone or in combination) drive and effect kinematic motion of the substrate transport arm 110, such that each of the N number of motors provides an independent drive axis T1, T2, . . . Tn effected as a corresponding independent rotation axis at each arm link joint (111J, 112J) and wrist joint 113J that generates alone or in combination motions of the substrate transport arm 110 that may be described as (R θ, Φ). As may be realized, a substrate transport arm 110 with N=3 motors in the kinematic portion 125KP has three degrees-of-freedom (R, θ, Φ) of kinematic motion. A substrate transport arm 110 with N=2 motors, the kinematic portion 125KP has two degrees-of-freedom (R, θ) or (R, Φ) of kinematic motion. A substrate transport arm 110 with N=4 motors, the kinematic portion 125KP has four degrees-of-freedom (R1, R2, θ, Φ) of kinematic motion. A degree-of-freedom describing, in the example shown in FIG. 3, motion path MP of the arm links 111, 112 from shoulder to wrist and end effector 113 (e.g., the motion path may be from one station to another station—see FIG. 1B) of the substrate transport arm 110, will be further described below. Generally, the kinematic motion includes displacement of the substrate transport arm 110, relative to the frame, along a motion path MP. In addition, it should be understood that while the accessory portion 125AP is described in the examples above as having one motor, in other aspects, the accessory portion 125AP may include any suitable number of motors for driving/powering any suitable number of accessories disposed on, e.g., the substrate transport arm 110.

Figure 8:
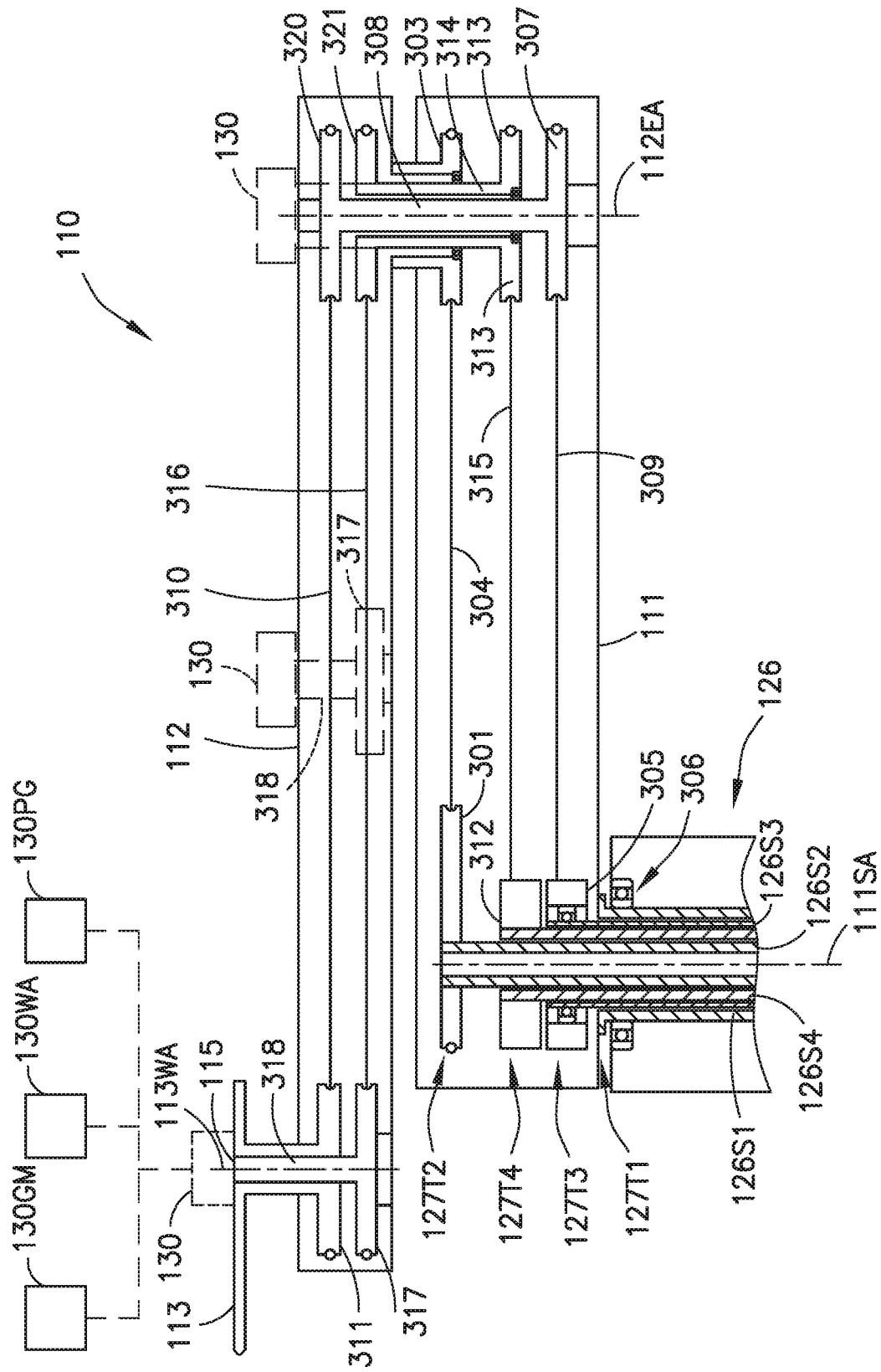
FIG. 8 is a schematic illustration of a portion of a substrate transport apparatus in accordance with aspects of the disclosed embodiment.
Figure 9:
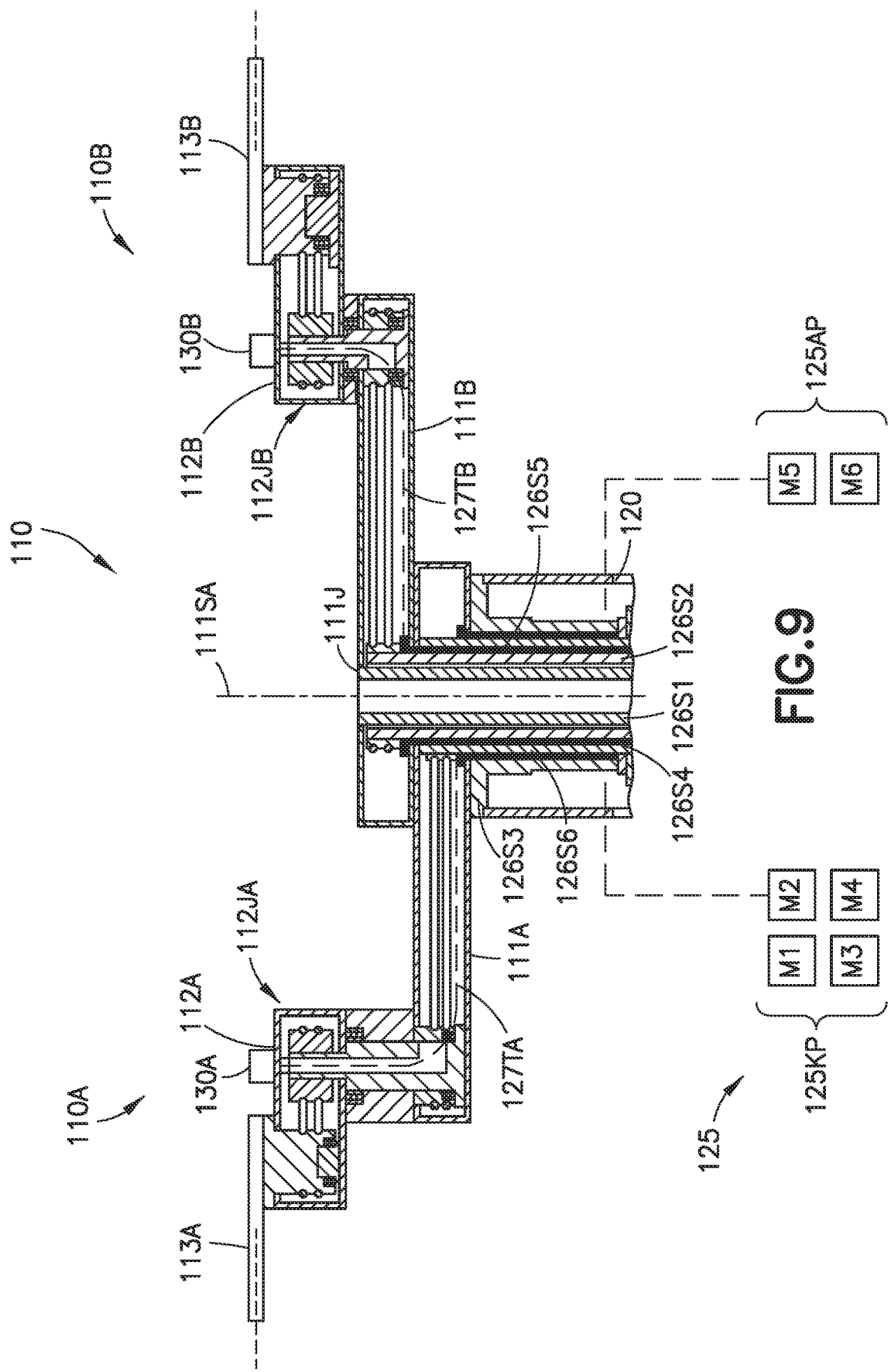
FIG. 9 is a schematic illustration of a portion of a substrate transport apparatus in accordance with aspects of the disclosed embodiment.

Referring now to FIGS. 3-3A and 8-9, as noted above, the substrate transport apparatus 100 includes at least one substrate transport arm 110 mounted to the base 120 and coupled to the drive section 125. It is noted that the four motor drive system of FIGS. 3-3A is being used as an example and that the aspects of the disclosed embodiment described below apply equally to the drive section configurations illustrated in FIGS. 4-7 or any other suitable drive section. In one aspect, the at least one substrate transport arm 110 may be any suitable articulated arm. In one aspect, the at least one substrate transport arm 110 may be a SCARA arm. In other aspects, the substrate transport arm 110 may have a configuration substantially similar to any one or more of the arms previously described with respect to FIGS. 2A-2E, such as a frog-leg arm 216 configuration, a leap-frog arm 217 configuration, a bi-symmetric arm 218 configuration, or any other suitable configuration. As seen in FIG. 8, the substrate transport apparatus includes one substrate transport arm 110 while in FIG. 9, the substrate transport apparatus 100 includes two substrate transport arms 110A, 110B. Each substrate transport arm 110A, 110B may be substantially similar to the arm depicted in FIG. 8 unless otherwise noted. In one aspect, each arm 110A, 110B may be independently operable where each arm is extended and retracted independent of the other arm, while in other aspects, the arms 110A, 110B may share a common motor so that the common motor extends and retracts the arms 110A, 110B substantially in unison. In one aspect, each arm link 111, 112, 113 may be driven by a respective degree-of-freedom of the drive section 125, while in other aspects, one or more of the links 111, 112, 113 may be slaved as will be further described below. In one aspect, the at least one substrate transport arm 110 includes an upper arm link 111, a forearm link 112, and at least one end effector 113. The upper arm link 111 is rotatably connected at a proximate end of the upper arm link 111 to the base 120 about a shoulder axis of rotation 111SA of the shoulder joint 111J. The forearm link 112 is rotatably connected at a proximate end of the forearm link 112 to a distal end of the upper arm link 111 about an elbow axis of rotation 112EA of the elbow joint 112J. The end effector 113 is rotatably coupled to a distal end of the forearm link 112 about a wrist axis of rotation 113WA of a wrist joint 113J. While only a single end effector 113 is illustrated as being coupled to the wrist joint 113J, in other aspects any suitable number of end effectors may be coupled to the wrist joint 113J to effect batch transfers of substrates or fast swapping of substrates. In one aspect, where each link of the substrate transport arm 110 is independently driven, each link of the substrate transport arm 110 (i.e. the upper arm link 111, forearm link 112, and end effector 113) is coupled to a respective drive shaft 126S1-126S3 with a respective transmission 127T1-127T3 as will be further described below.

In other aspects, one or more links of the substrate transport arm 110 may be slaved to another arm link or the base 120 so that the substrate transport arm 110 is extended and retracted with fewer motors than arm links with the end effector 113 following a predetermined motion path MP (see FIG. 1B). For example, referring to FIG. 9, the kinematic portion 125KP of the drive section 125 may include motors 125M1-125M4, while accessory portion 125AP includes motors 125M5, 125M6. The motors of the kinematic portion 125KP are coupled to a respective drive shaft 126S1-126S4 to drive the substrate transport arms 110A, 110B. As may be realized, motor 125M1 is coupled to drive shaft 126S1 to drive the upper arm link 111B of substrate transport arm 110B and motor 125M2 is coupled to drive shaft 126S2 to drive the forearm link 112B of substrate transport arm 110B. The end effector 113B is slaved to the upper arm link 111B via transmission 127TB. Motor 125M3 is coupled to drive shaft 126S3 to drive the upper arm link 111A of substrate transport arm 110A. Motor 125M4 is coupled to drive shaft 126S4 to drive the forearm link 112A of substrate transport arm 110A. Substantially similar to arm 110B, the end effector 113A is slaved to the upper arm link 111A via transmission 127TA. The motors 125M5, 125M6 of the accessory portion 125AP are coupled to a respective accessory device 130 on a respective substrate transport arm 110A, 110B. For example, motor 125M5 is coupled to drive shaft 126S5. Transmission 127T5 is coupled to the drive shaft 126S5 and fed through substrate transport arm 110B to elbow joint 112JB where power is provided to accessory device 130B. Substrate transport arm 110A has a substantially similar accessory feedthrough as substrate transport arm 110B, such that motor 125M6 is coupled to drive shaft 126S6. Transmission 127TA is couple to drive shaft 126S6 and fed through to elbow joint 112JA where power is provided to accessory device 130A In one aspect, the substrate transport arm 110 has N number of degrees-of-freedom, defined by the N number of the more than one drive motors 125M1-125M4, of the kinematic portion 125KP. For example, as illustrated in FIGS. 3, 3A, and 8, the upper arm link 111, forearm link 112 and end effector 113 are coupled to a respective motor 125M1-125M3, via the drive shafts 126S1-126S3, of the kinematic portion 125KP of the drive section 125. As may be realized, the first drive shaft 126S1 is drivingly connected to motor 125M1 for driving rotation of the upper arm link 111 about the shoulder axis of rotation 111SA of the shoulder joint 111J. The second drive shaft 126S2 (which in this aspect is concentric/coaxial with the first drive shaft 126S1) is drivingly connected to motor 125M2 for driving rotation of the forearm link 112 about the elbow axis of rotation 112EA of the elbow joint 112J. The third drive shaft 126S3 (which in this aspect is concentric/coaxial with the first and second drive shafts 126S1, 126S2) is drivingly connected to motor 125M3 for driving rotation of the end effector 113 about the wrist axis of rotation 113WA of the wrist joint 113J.

Referring to FIGS. 3, 3A, and 8, as noted above, the kinematic portion 125KP of the drive section 125 is coupled to the substrate transport arm 110 and configured to drive a respective drive shaft 126S1-126S3, such that the kinematic portion 125KP effects the kinematic motion of the substrate transport arm 110. In one aspect, a kinematic motion path of the substrate transport arm 110 is described by at least one of the N number of degrees-of-freedom. In order to drive each link 111, 112, 113, as noted above, the substrate transport arm 110 includes one or more transmissions 127T1-127T3. For example, a first transmission 127T1 includes a coupling 306 drivingly coupling drive shaft 126S1 to the upper arm link 111. A second transmission 127T2 includes pulleys 301, 303 and a transmission member 304 for drivingly coupling drive shaft 126S2 to the forearm link 112. A third transmission 127T3 includes pulleys 305, 307, 311, 320, transmission members 309, 310, and a post 308 for drivingly coupling drive shaft 126S3 to the end effector 113.

The upper arm link 111 is fixedly attached, via the first transmission 127T1, to the outer drive shaft 126S1 such that the upper arm link 111 rotates with the drive shaft 126S1 as a unit about the shoulder axis of rotation 111SA. Pulley 301 of the second transmission 127T2 is fixedly attached to drive shaft 126S2 so as to rotate with the drive shaft 126S2 as a unit about the shoulder axis of rotation 111SA. Pulley 303 of the second transmission 127T2 is mounted to an inner surface of the upper arm link 111 about the elbow axis of rotation 112EA. The transmission member 304 extends between pulley 301 and pulley 303. It should be realized that any suitable type of transmission member may be used to couple the pulleys 301, 303, such as for example, a belt, band or chain and further that the transmission member may have any suitable configuration such a split band transmission or continuous loop transmission. Suitable examples of split band and continuous loop transmissions can be found in, for example, U.S. patent application Ser. No. 14/469,260 entitled "Substrate Transport Apparatus" and filed on Aug. 26, 2014, and U.S. Pat. No. 9,230,841 issued Jan. 5, 2016, the disclosures of which are incorporated by reference herein in their entireties. It should also be realized that while one transmission member is shown coupling the pulleys 301, 303 any suitable number of transmission members may be used to couple the pulleys 301, 303 (e.g. more than one). The forearm link 112 is fixedly attached to the pulley 303 so as to rotate with the pulley 303 about the elbow axis of rotation 112EA. As such, as drive shaft 126S2 rotates, the forearm link 112 rotates about the elbow axis of rotation 112EA.

Pulley 305 of the third transmission 127T3 is fixedly coupled to drive shaft 126S3 so as to rotate with the drive shaft 126S3 as a unit about the shoulder axis of rotation 111SA. Pulley 307 is mounted to an inner surface of the upper arm link 111 and pulley 320 is mounted to an inner surface of the forearm link 112, both pulleys 307, 320 being mounted about the elbow axis of rotation 112EA and having post 308 extending across the articulated elbow joint 112J coupling the two pulleys 307, 320 so that the pulleys 307, 320 rotate as a unit about the elbow axis of rotation 112EA. Transmission member 309 extends between pulley 305 and pulley 307. Pulley 311 is mounted to an inner surface of the forearm link 112 about the wrist axis of rotation 113WA. Transmission member 310 is extends between pulley 311 and pulley 320. The end effector 113 is fixedly attached to the pulley 311 so as to rotate with the pulley 311 about the wrist axis of rotation 113EA. As such as drive shaft 126S3 rotates, the end effector 113 rotates about the wrist axis of rotation 113WA. As may be realized, in this aspect, the substrate transport arm 110 has 3 degrees-of-freedom defined by the three motors 125M1-125M3. In other aspects, such as where the kinematic portion 125KP has one motor, the substrate transport arm 110 may have a slaved configuration such that the single motor drives a transmission operably coupled to each of the upper arm link 111, the forearm link 112, and the end effector 113.

Still referring to FIGS. 3, 3A, and 8, in one aspect, the accessory portion 125AP of the drive section 125 is operably coupled to and configured to drive one or more accessory device(s) 130. In one aspect, the accessory portion 125AP of the drive section 125 is operably coupled to the one or more accessory device(s) 130 so as to power and/or drive the one or more accessory device(s) 130. In one aspect, the one or more accessory device(s) 130 has a degree-of-freedom motion axis accessory to each motion path of the substrate transport arm 110. As noted above, the accessory portion 125AP of the drive section 125 has a different and distinct motor(s) than the kinematic portion 125KP. The accessory portion 125AP having a different and distinct motor(s) provides for the one or more accessory device(s) 130 to be driven independent of the kinematic motion (and each motion path provided thereby) of the substrate transport arm 110.

As illustrated in FIGS. 3, 3A, and 8, the accessory portion 125AP of the drive section 125 includes, e.g., motor 125M4 coupled to drive shaft 126S4. In one aspect, the substrate transport arm 110 further includes at least another transmission 127T4 movably mounted within the substrate transport arm 110, extending from the base 120 through the substrate transport arm 110 to, e.g., the wrist joint 113J. The at least another transmission 127T4 is configured to, via drive torque generated by the motor 125M4 of the accessory portion 125AP, drive/power one or more accessory device(s) 130. As noted above, the at least another transmission 127T4 effects drive power of the one or more accessory device(s) 130 independent of the N number of degrees of freedom of the kinematic motion of the substrate transport arm 110. In one aspect, the at least another transmission 127T4 includes pulleys 312, 313, 317, 321, transmission members 312, 316, and posts 314, 318. It is noted that the at least another transmission 127T4 may include more or less pulleys, transmission members, and posts, such as where the accessory portion 125AP does not extend from the base 120 all the way to the wrist joint 113J. For example, in other aspects, the at least another transmission 127T4 of the accessory portion 125AP may extend from the base 120 partially through the substrate transport arm 110 to, e.g., the elbow joint 112J or any other portion of, for example, the forearm link 112 or the upper arm link 111.

Still referring to FIG. 8, as illustrated, pulley 312 of the at least another transmission 127T4 is fixedly coupled to drive shaft 126S4 so as to rotate with the drive shaft 126S4 as a unit about the shoulder axis 111SA. Pulley 313 is mounted to an inner surface of the upper arm link 111 and pulley 321 is mounted to an inner surface of the forearm link 112, both pulleys 313, 321 being mounted about the elbow axis of rotation 112EA with post 314 extending across the articulated elbow joint 112J and coupling the two pulleys 313, 321 so that the pulleys 313, 321 rotate as a unit about the elbow axis of rotation 112EA. Transmission member 315 is extended between pulley 313 and pulley 321. Pulley 317 is mounted to an inner surface of the forearm link 112 about the wrist axis of rotation 113WA. Transmission member 316 is extended between pulley 316 and pulley 321. The post 318 is coupled to pulley 317 and extends along the wrist joint 113J where one or more accessory device(s) 130 is attached to the post 308 to be driven/powered as will be further described below. As such, the at least another transmission 127T4 operably couples the accessory portion 125AP of the drive section 125 to the one or more accessory device(s) 130. It is noted that the components of the at least another transmission 127S4 are sized or otherwise configured to provide sufficient motion for the kinematic portion 125KP and the accessory portion 125AP, such that the accessory portion 125AP has sufficient freedom of motion to accommodate, without restraint, the kinematic motions of the substrate transport arm 110 and provide drive torque throughout the range of substrate transport arm 110 motion. For example, where the transmission members 315, 316 comprise bands, the pulleys may be sized and the bands may be wrapped around the pulley by an amount sufficient to allow operation of the one or more accessory device(s) 130 without restraining movement of the substrate transport arm 110.

In one aspect, the post 318 may include an accessory drive output port 115 as will be further described below. As noted above, the at least another transmission 127T4 of the accessory portion 125AP may not extend all the way through the substrate transport arm 110 to the end effector 113 and may extend partially through to, e.g., the elbow joint 112J or any other portion of, for example, the forearm link 112 or the upper arm link 111. As may be realized, in the event the accessory portion 125AP does not extend all the way through to the end effector 113, the configuration of the drive shaft 126S1-126S4 and pulleys 301, 313, 305, 307, 311, 312, 312, 317, 320, 321 may change.

As noted above, the accessory portion 125AP is configured to drive or power one or more accessory device(s) 130. In one aspect, the end effector 113 and/or the substrate transport arm 110 may include, coupled to the end effector 113 or at any suitable location of the substrate transport arm 110, the one or more accessory device(s) 130. The one or more accessory device(s) 130 may include a gripping mechanism 130GM, a substrate aligner 130WA, a power generator 130PG and/or any other suitable accessory device. The accessory portion 125AP of the drive section 125, which may utilize either the split band or continuous loop transmission as noted above, is configured to power and/or drive each respective characteristic (e.g., gripping, aligning, power generation, or any other suitable operational characteristic) of a respective accessory device 130GM, 130WA, 130PG.

Still referring to FIG. 8, in one aspect, each of the one or more accessory device(s) 130 may be easily swapped with another accessory device 130PG, 130WA, 130GM having a different predetermined characteristic. For example, the substrate transport arm 110 may be a modular arm, such that different accessory devices 130PG, 130WA, 130GM, each having a respective predetermined characteristic different from the predetermined characteristic of the other accessory devices 130PG, 130WA, 130GM, may be interchanged and mounted on the modular substrate transport arm. In one aspect, as seen in FIG. 8, the modular arm includes the accessory drive output port 115 which may be substantially similar to a power take-off. For example, in one aspect, the accessory drive output port 115 may be a release coupling. In one aspect, the accessory drive output port 115 may be a pulley of one of the transmission couplings having an inner spline to which the end effector 113 or one or more accessory device(s) 130 is inserted and coupled, such as for example, post 318. In other aspect, the accessory drive output port 115 may be any suitable apparatus to couple the end effector 113 or one or more accessory device(s) 130 to the substrate transport arm 110.

Although illustrated as being located at the wrist joint 113J, as noted above, the accessory drive output port 115 may be located at the elbow joint 112J, on the forearm link 112, on the upper arm link 111, or in any suitable location. In one aspect, the accessory drive output port 115 is configured to receive the end effector 113 or one or more accessory device(s) 130 and integrate the end effector 113 or one or more accessory device(s) 130 with the motor(s) of the accessory portion 125AP as described herein.

Figure 10:
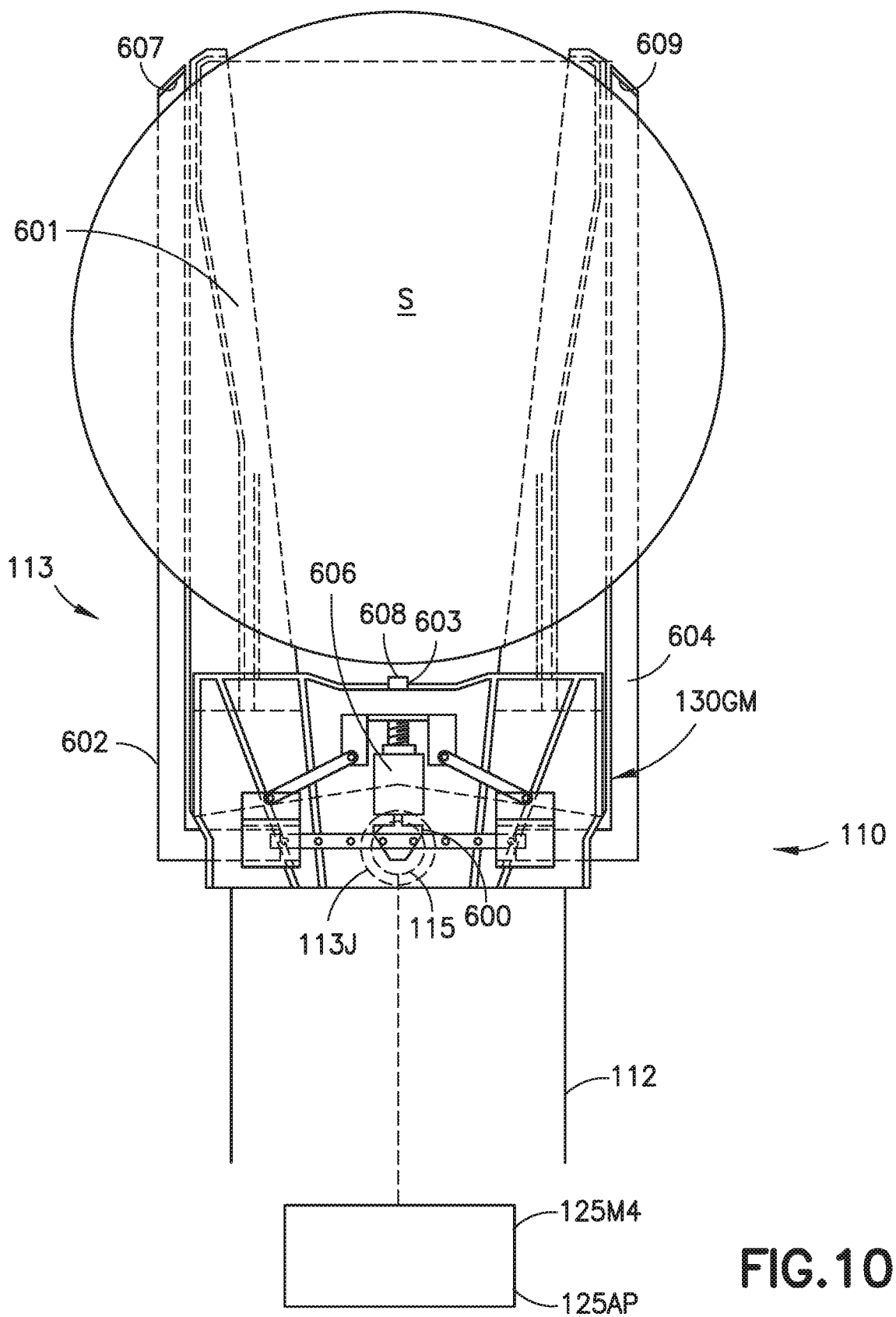
FIG. 10 is a schematic illustration of a portion of a substrate transport apparatus in accordance with aspects of the disclosed embodiment.

Referring now to FIG. 10, the gripping mechanism 130GM is mounted to the end effector 113 in any suitable manner so as to interface with a substrate S supported by a substrate support surface 601 of end effector 113. The gripping mechanism 130GM includes movable edge grippers 602, 603 and 604 that are moved toward the substrate S under motive power of the motor 125M4 of the accessory portion 125AP. For example, the motor 125M4 is coupled to the gripping mechanism 130GM through transmission 127T4 so as to drive movement of the edge grippers 602, 603, 604. In one aspect, the transmission 127T4 is coupled to a linear actuator 606 of the gripping mechanism 130GM by a transmission 600 of the gripping mechanism 130Gm. In one aspect, the linear actuator 606 may be a screw or belt drive and the transmission 600 may be any suitable geared or other transmission configured to turn rotary motion of the post 318 (and the accessory drive output port 115) (see FIG. 8) into motion that drives the linear actuator 606. Here, linear movement of the linear actuator 606 causes respective contact pads 607, 608 and 609 to engage the edge of the substrate S. The contact pads 607, 608 and 609 may each comprise an upper and lower lip forming an included angle therebetween, the substrate edge being held within the included angle. Transmission 127T4 is fed through the substrate transport arm 110 to the accessory drive output port 115 located at the wrist joint 113J as described above. Motor 125M4 of the accessory portion 125AP of the drive section 125 (kinematic portion 125KP is not shown) provides drive power to the accessory drive output port 115 to turn transmission 600. Transmission 600 causes the linear actuator 606 to actuate the gripping mechanism 130GM to grip the substrate S. Another suitable example of an active grip mechanism to which the aspects of the disclosed embodiment may be applied is described in U.S. patent application Ser. No. 10/196,679 (filed on Jul. 15, 2002) which is hereby incorporated by reference in its entirety. In other aspects, the end effector may have any other suitable active edge grip mechanism such as a vertical grip mechanism to grip a topside and/or backside of the substrate S.

Figure 11:
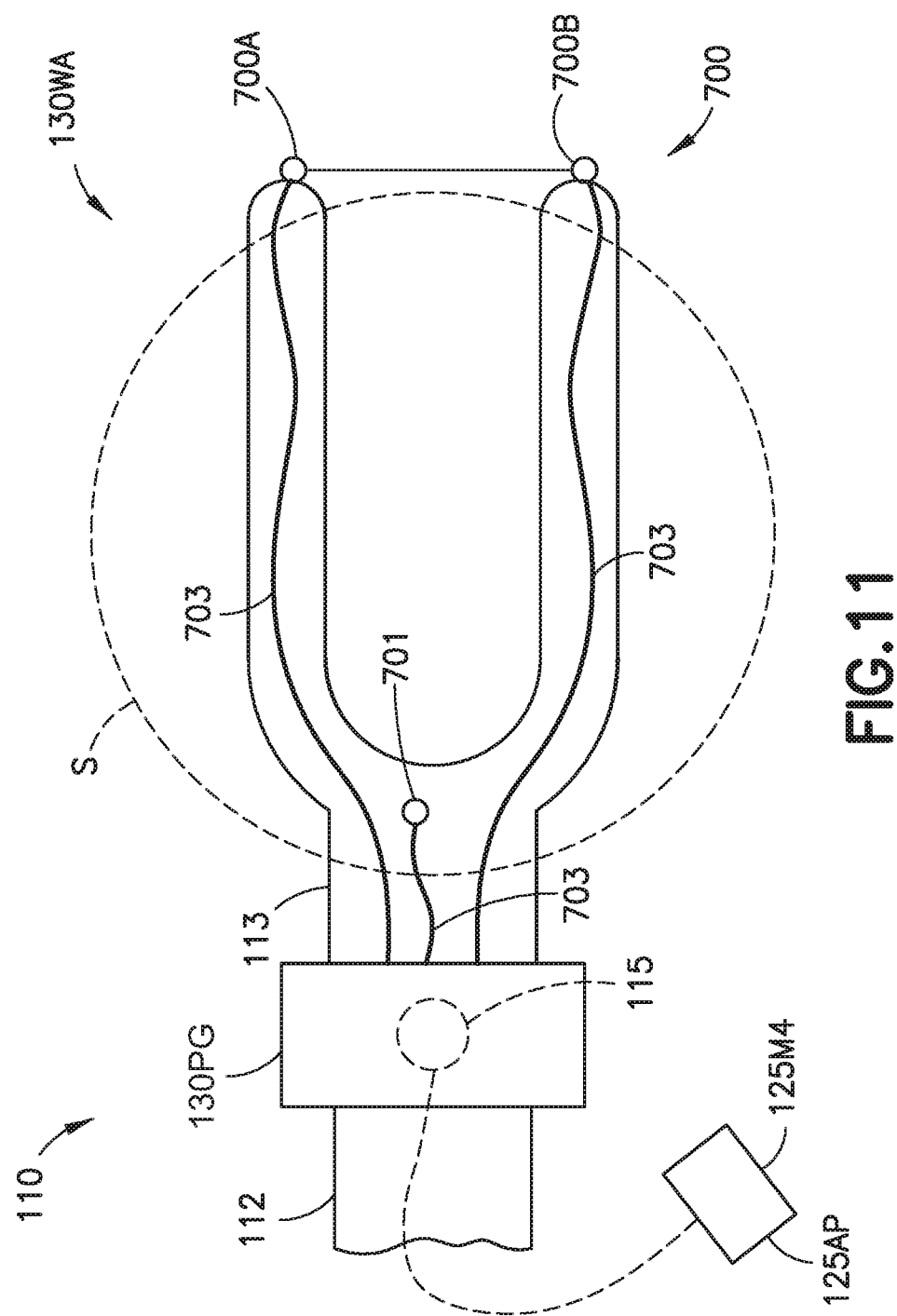
FIG. 11 is a schematic illustration of a portion of a substrate transport apparatus in accordance with aspects of the disclosed embodiment.

FIG. 11 illustrates substrate mapping/presence sensors powered by power generator 130PG. For example, the end effector 113 includes a substrate presence sensor 701 positioned on the end effector 113 to detect the presence or absence of the substrate S on the end effector 113. The end effector 113 may also include a mapping sensor 700 for mapping substrates within the processing tool (such as substrates stacked in a cassette or buffer. In one aspect, the sensor 700 is a through beam sensor having a beam emitter 700A and a beam receiver 700B. Signals from the sensors 700, 701 may be transmitted to any suitable controller, such as controller 11091, in any suitable manner, such as through wireless communication. The sensors 700, 701 are powered by the power generator 130PG located, in this aspect on the wrist joint 113J and connected to the accessory drive output port 115. Motor 125M4 of the accessory portion 125AP of the drive section 125 (kinematic portion 125KP is not shown) provides mechanical/motive power to the accessory drive output port 115. The power generator 130PG attached to the accessory drive output port 115 is driven by the motor 125M4 to generate electric power to power the sensors 700, 701 and any wireless transmitters coupled to the sensors 700, 701. The power generator 130PG is connected to the sensors 700, 701 via electrical power transmission conduits 703 that provide electrical power from the power generator 130PG to power the sensors.

Figure 12:
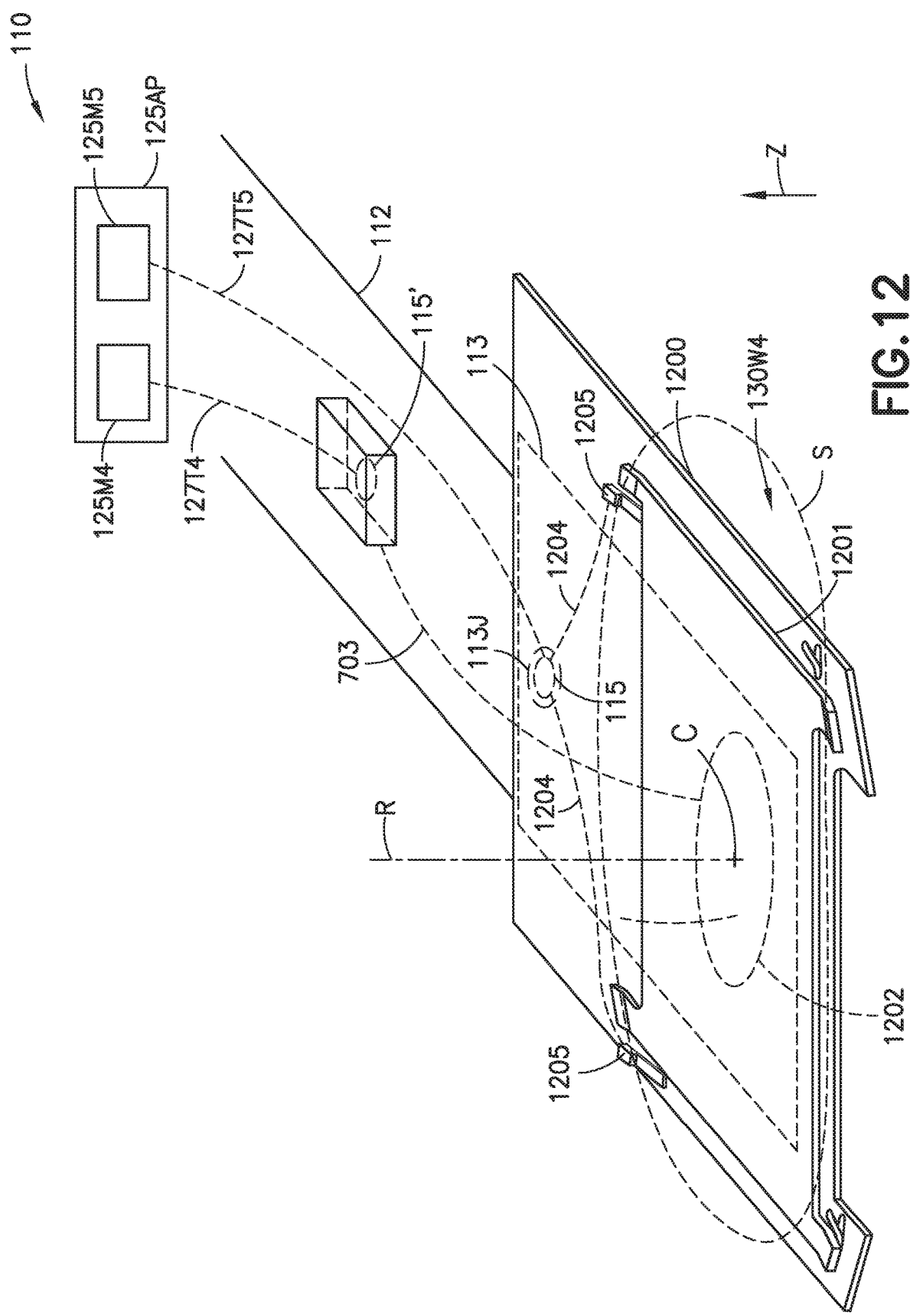
FIG. 12 is a schematic illustration of a portion of a substrate transport apparatus in accordance with aspects of the disclosed embodiment.

Referring now to FIG. 12, the substrate aligner 130WA accessory device is illustrated as being attached to end effector 113 in any suitable manner so that the substrate aligner 130WA supports the substrate S on the end effector 113. In this aspect, the accessory portion 125AP includes two motors (e.g., 125M4, 125M5—it is noted that the kinematic portion 125KP of the drive section 125 is not shown) to power/drive the substrate aligner 130WA. The substrate aligner 130WA includes a base 1200, a chuck 1201, and a motor 1202. The base 1200 is generally configured to mount to the end effector 113 of the substrate transfer arm 110. The chuck 1201 is rotatably supported on the base 1200. The chuck 1201 has structures for holding a substrate S by, e.g., passively edge gripping the substrate. The motor 1202 is disposed at least partially within the base 1200 and is connected to the chuck 1201 to rotate the chuck 1201 relative to the base 1200. The motor 1202 has an axis of motion R extending substantially through the center C of the substrate S when the substrate is held by the chuck 1201. The substrate aligner 130WA further includes elevatable supports 1205 which are raised or elevated from the upper surface of the base 1200 (in the direction indicated by arrow Z) to lift the substrate S from the chuck 1201.

Electrical power is received by motor 1202 from, e.g., the power generator 130PG which as described above is driven by motor 125M4 of the accessory portion 125AP. The power generator 130PG is positioned on the forearm link 112 and connected to accessory drive output port 115' (substantially similar to accessory drive output port 115) which is also disposed along a length of the forearm link 112. Transmission 127T4 is fed through the substrate transport arm 110 to the accessory drive output port 115' located at the forearm link 112. The power generator 130PG attached to the accessory drive output port 115' is driven by motor 125M4 to generate electrical power to power the motor 1202 via electrical power transmission conduits 703 to rotate the chuck 1201 to a desired orientation.

The elevatable supports 1205 are provided for the substrate S to be seated on, in an elevated position after rotational alignment of the substrate, while the chuck 1201 is reset, using motor 1202, to for example a home or zeroed position to align the chuck 1201 with the end effector 113 for placing the substrate S. The elevatable supports 1205 may be lowered to return the substrate S to the chuck 1201. The orientation of the substrate S is thus maintained while the chuck 1201 position is reset. The elevatable supports 1205 are driven/powered by the second motor 125M2 of the accessory portion 125AP of the drive section 125. Transmission 127T5 is fed through the substrate transport arm 110 to the accessory drive output port 115 located at, e.g., the wrist joint 113J. Any suitable transmission 1204 (which may be substantially similar to transmission 600 described above with respect to FIG. 10) may be utilized to provide the mechanical motive power from the accessory drive output port 115 to the elevatable supports 1205. As noted above, the substrate aligner 130WA may also be configured for one or more of detecting a missing substrate S and/or detecting a substrate thickness.

In other aspects, the motor 125M4 of the accessory portion 125AP may be utilized for monitoring in-situ movement, via feedback from the motor 125M4 of the accessory portion 125AP. For example, in-situ movement monitoring may be realized via monitoring torque of the motor by, e.g., measuring the current draw from the motor 125M4. The torque can be monitored to detect, e.g., grip of the substrate S to determine whether the substrate is engaged by the gripper mechanism 130GM. As may be realized, upon engagement of the substrate with the gripper, the current draw of the motor 125M4 will increase. If the substrate disengages, the current draw of the motor 125M4 will decrease. In other aspects, an encoder 500 (FIG. 5) may be included on the motor 125M4 of the accessory portion 125AP to identify displacement of the substrate transport arm 110 by monitoring displacement (i.e. rotation and movement) of the motor via the encoder 500.

Figure 13:
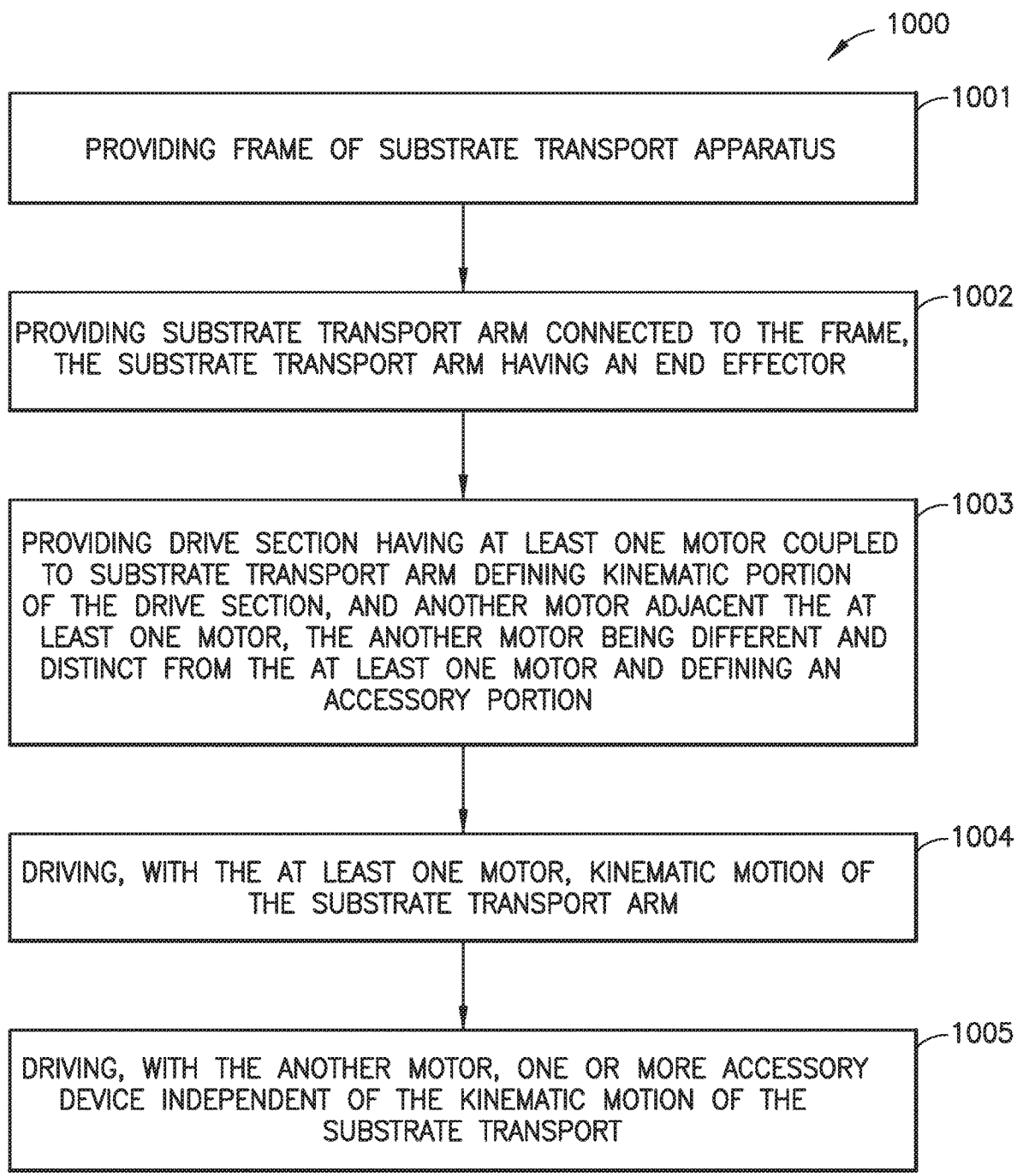
FIG. 13 is a flow chart of a method of operation of a substrate transport apparatus in accordance with one or more aspects of the disclosed embodiment.

Referring now to FIG. 13, a method 1000 of an exemplary operation of the substrate transport apparatus 100 including an independent mechanical feedthrough for driving an accessory device is illustrated. In one aspect, the method 1000 includes providing a frame 106 of substrate transport apparatus 100 (FIG. 13, Block 1001). The method further includes providing a substrate transport arm 110 connected to the frame 106, the substrate transport arm 110 having an end effector 113 (FIG. 13, Block 1002). The method 1000 further includes providing a drive section 125 having at least one motor coupled to the substrate transport arm 110. The at least one motor 125M1-125M3 of the drive section 125 defines a kinematic portion 125KP of the drive section 125, and another motor 125M4 adjacent the at least one motor 125M1-125M3 defines an accessory portion 125AP of the drive section 125. The another motor 125M4 being different and distinct from the at least one motor 125M1-125M3 (FIG. 13, Block 1003). The method 1000 further includes driving, with the at least one motor, kinematic motion of the substrate transport arm 110 to displace the substrate transport arm 110 along a motion path MP (see FIG. 1B) relative to the frame 106 (FIG. 13, Block 1003). The method 1000 further includes driving, with the another motor 125M4, one or more accessory device 130 independent of the kinematic motion of the substrate transport arm 110 (FIG. 13, Block 1004).

Figure 14:
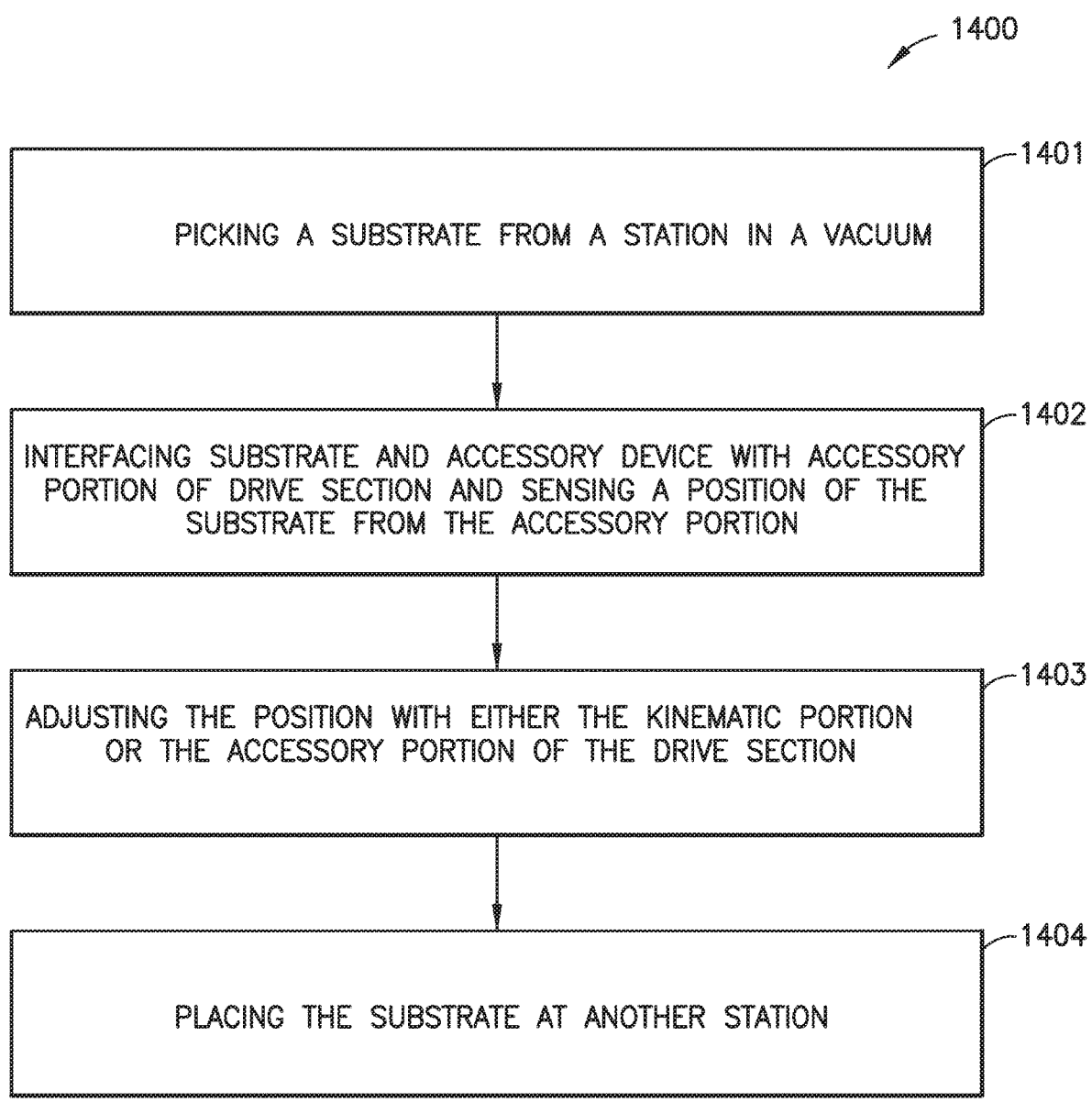
FIG. 14 is a flow chart of a method of operation of a substrate transport apparatus in accordance with one or more aspects of the disclosed embodiment.

Referring now to FIG. 14, a method 1400 of an exemplary operation of the substrate transport apparatus 100 including an independent mechanical feedthrough for driving an accessory device is illustrated. In one aspect, the method 1400 includes picking, with the substrate transport arm 110 of the substrate transport apparatus 100, a substrate from a station in, for example, a vacuum (FIG. 14, Block 1401). The substrate may be picked from any suitable station such as those described above with respect to FIGS. 1A-1H (i.e., a load port, processing station, buffer, etc.). The method 1400 further includes, along the motion path MP between the station, interfacing the substrate S and the accessory device 130 with the accessory portion 125AP of the drive section 125 and sensing a position of the substrate from the accessory portion 125AP (FIG. 14, Block 1402) with any suitable sensor, for example, a wafer centering sensor or any other suitable sensor for sensing a position which may be located, for example, on the substrate transport arm 110 or at any of the stations. Upon sensing the position, the kinematic portion 125KP of the accessory portion 125AP of the drive section 125 may adjust the position (FIG. 14, Block 1403) with, for example, the substrate aligner WA device described previously with respect to FIG. 12. The substrate is placed at another station which may be different from the station from which it was picked or the same station (FIG. 14, Block 1404).

In accordance with one or more aspects of the disclosed embodiments a substrate transport apparatus is provided. The substrate transport apparatus including a frame, a substrate transport arm connected to the frame, the substrate transport arm having an end effector, and a drive section having at least one motor coupled to the substrate transport arm, wherein the at least one motor defines a kinematic portion of the drive section configured to effect kinematic motion of the substrate transport arm, and the drive section includes an accessory portion adjacent the kinematic portion, wherein the accessory portion has another motor, different and distinct from the at least one motor, the another motor of the accessory portion is operably coupled to and configured to drive one or more accessory device independent of the kinematic motion of the substrate transport arm.

In accordance with one or more aspects of the disclosed embodiments the another motor of the accessory portion drives the one or more accessory device via at least one kinematic transmission coupling.

In accordance with one or more aspects of the disclosed embodiments the substrate transport arm is an articulated arm and the at least one kinematic transmission coupling extends across at least one articulated joint of the articulated arm.

In accordance with one or more aspects of the disclosed embodiments the one or more accessory device comprises one or more of a gripper mechanism, a substrate aligner, or an electric power generator.

In accordance with one or more aspects of the disclosed embodiments the gripper mechanism is configured to grip an edge of a substrate or vertically grip a topside and backside of the substrate.

In accordance with one or more aspects of the disclosed embodiments the substrate aligner is configured for one or more of detecting a missing substrate, detecting a substrate thickness, and monitoring in-situ movement, via feedback from the another motor of the accessory portion.

In accordance with one or more aspects of the disclosed embodiments the at least one motor is N number of motors providing the substrate transport arm with N degrees of freedom.

In accordance with one or more aspects of the disclosed embodiments the at least one motor comprises three motors, each of the three motors configured to drive a respective one of vertical, rotational, or horizontal plane motion of the substrate transport arm.

In accordance with one or more aspects of the disclosed embodiments the substrate transport apparatus comprises at least one tool for a processing apparatus.

In accordance with one or more aspects of the disclosed embodiments a method is provided. The method including providing a frame of a substrate transport apparatus, providing a substrate transport arm connected to the frame, the substrate transport arm having an end effector, providing a drive section having at least one motor coupled to the substrate transport arm defining a kinematic portion of the drive section, and another motor adjacent the at least one motor, the another motor being different and distinct from the at least one motor and defining an accessory portion, driving, with the at least one motor, kinematic motion of the substrate transport arm, and driving, with the another motor, one or more accessory device independent of the kinematic motion of the substrate transport arm.

In accordance with one or more aspects of the disclosed embodiments further including driving, with at least one kinematic transmission coupling of the another motor of the accessory portion, the one or more accessory device.

In accordance with one or more aspects of the disclosed embodiments the substrate transport arm is an articulated arm and the at least one kinematic transmission coupling extends across at least one articulated joint of the articulated arm.

In accordance with one or more aspects of the disclosed embodiments the one or more accessory device comprises one or more of a gripper mechanism, a substrate aligner, or an electric power generator.

In accordance with one or more aspects of the disclosed embodiments further including gripping, with the gripper mechanism, an edge of a substrate or vertically gripping a topside and backside of the substrate.

In accordance with one or more aspects of the disclosed embodiments further including detecting, with the substrate aligner, a missing substrate, a substrate thickness, and/or monitoring in-situ movement, via feedback from the another motor of the accessory portion.

In accordance with one or more aspects of the disclosed embodiments the at least one motor is N number of motors providing the substrate transport arm with N degrees of freedom.

In accordance with one or more aspects of the disclosed embodiments the at least one motor comprises three motors, the method further comprising driving, with each of the three motors, a respective one of vertical, rotational, or horizontal plane motion of the substrate transport arm.

In accordance with one or more aspects of the disclosed embodiments further including operating the one or more accessory device on the substrate transport arm in motion.

In accordance with one or more aspects of the disclosed embodiments further including operating the one or more accessory device on the substrate transport arm at a substrate holding station In accordance with one or more aspects of the disclosed embodiments a substrate transport arm is provided. The substrate transport arm including a multi-link arm assembly having an end effector, and a drive section having at least one motor coupled to the substrate transport arm, wherein the at least one motor defines a kinematic portion of the drive section configured to effect kinematic motion of the substrate transport arm, and the drive section includes an accessory portion adjacent the kinematic portion, wherein the accessory portion has another motor, different and distinct from the at least one motor, the another motor of the accessory portion is operably coupled to and configured to drive one or more accessory device independent of the kinematic motion of the substrate transport arm.

In accordance with one or more aspects of the disclosed embodiments the another motor of the accessory portion drives the one or more accessory device via at least one kinematic transmission coupling.

In accordance with one or more aspects of the disclosed embodiments the multi-link arm assembly is an articulated arm and the at least one kinematic transmission coupling extends across at least one articulated joint of the articulated arm.

In accordance with one or more aspects of the disclosed embodiments the one or more accessory device comprises one or more of a gripper mechanism, a substrate aligner, or an electric power generator.

In accordance with one or more aspects of the disclosed embodiments the gripper mechanism is configured to grip an edge of a substrate or vertically grip a topside and backside of the substrate.

In accordance with one or more aspects of the disclosed embodiments the substrate aligner is configured for one or more of detecting a missing substrate, detecting a substrate thickness, and monitoring in-situ movement, via feedback from the another motor of the accessory portion.

In accordance with one or more aspects of the disclosed embodiments the at least one motor is N number of motors providing the substrate transport arm with N degrees of freedom.

In accordance with one or more aspects of the disclosed embodiments the at least one motor is in a common housing.

In accordance with one or more aspects of the disclosed embodiments a workpiece transport apparatus is provided. The workpiece transport apparatus including a frame, a base drive section connected to the frame and having more than one drive motors, an articulated arm having at least one end effector with at least one workpiece holding station thereon, and operably coupled to the base drive section wherein N number of the more than one drive motors are configured so as to coincidentally drive and effect kinematic motion of the articulated arm with N number of degree-of-freedom, defined by the N number of the more than one drive motors, displacing the workpiece holding station relative to the frame along a motion path described by at least one of the N number of degree-of-freedom, and an accessory device connected to the articulated arm and operably coupled to the base drive section, wherein the base drive section has at least one drive motor, of the more than one drive motors, that is an accessory drive motor different and distinct from each of the N number of the more than one drive motors defining each of the N number of degree-of-freedom describing each motion path of each workpiece holding station, the accessory drive motor being operably coupled to the accessory device so as to power the accessory device.

In accordance with one or more aspects of the disclosed embodiments the more than one drive motors are in a common housing.

In accordance with one or more aspects of the disclosed embodiments the accessory device has a degree-of-freedom motion axis accessory to each motion path of each workpiece holding station.

In accordance with one or more aspects of the disclosed embodiments further including an accessory kinematic transmission operably coupling the accessory drive motor and accessory device, and having at least one kinematic transmission member movably mounted within an articulated arm portion of the articulated arm, through which kinematic transmission member drive torque, generated by the accessory drive motor is transferred to the accessory device so as to effect drive power of the accessory device independent of the N number of degree-of-freedom of the kinematic motion of the articulated arm.

In accordance with one or more aspects of the disclosed embodiments the accessory device comprises one or more of a gripper mechanism, a substrate aligner, or an electric power generator.

In accordance with one or more aspects of the disclosed embodiments the gripper mechanism is configured to grip an edge of a substrate or vertically grip a topside and backside of the substrate.

In accordance with one or more aspects of the disclosed embodiments the substrate aligner is configured for one or more of detecting a missing substrate, detecting a substrate thickness, and monitoring in-situ movement, via feedback from the another motor of the accessory portion.

In accordance with one or more aspects of the disclosed embodiments the more than one drive motors comprises three drive motors, each of the three drive motors configured to drive a respective one of vertical or rotational motion of the articulated arm.

In accordance with one or more aspects of the disclosed embodiments the workpiece transport apparatus comprises at least one tool for a processing apparatus.

In accordance with one or more aspects of the disclosed embodiments a workpiece transport apparatus is provided. The workpiece transport apparatus including a frame, a base drive section connected to the frame and having more than one drive motors, an articulated arm having at least one end effector with at least one workpiece holding station thereon, and operably coupled to the base drive section wherein N number of the more than one drive motors are configured so as to coincidentally drive and effect kinematic motion of the articulated arm with N number of degree-of-freedom, defined by the N number of the more than one drive motors, displacing the workpiece holding station relative to the frame along a motion path described by at least one of the N number of degree-of-freedom, and an accessory drive output port connected to the articulated arm and operably coupled to the base drive section, wherein the base drive section has at least one drive motor, of the more than one drive motors, that is an accessory drive motor different and distinct from each of the N number of the more than one drive motors defining each of the N number of degree-of-freedom describing each motion path of each workpiece holding station, the accessory drive motor being operably coupled to the accessory drive output port so as to provide power to the accessory drive output port.

In accordance with one or more aspects of the disclosed embodiments the more than one drive motors are in a common housing.

In accordance with one or more aspects of the disclosed embodiments the accessory device has a degree-of-freedom motion axis accessory to each motion path of each workpiece holding station.

In accordance with one or more aspects of the disclosed embodiments further including an accessory kinematic transmission operably coupling the accessory drive motor and accessory drive output port, and having at least one kinematic transmission member movably mounted within an articulated arm portion of the articulated arm, through which kinematic transmission member drive torque, generated by the accessory drive motor is transferred to the accessory drive output port so as to effect drive power of the accessory drive output port independent of the N number of degree-of-freedom of the kinematic motion of the articulated arm.

In accordance with one or more aspects of the disclosed embodiments further including an accessory device comprising one or more of a gripper mechanism, a substrate aligner, or an electric power generator, wherein the accessory drive output port is configured to receive and power the accessory device.

In accordance with one or more aspects of the disclosed embodiments the gripper mechanism is configured to grip an edge of a substrate or vertically grip a topside and backside of the substrate.

In accordance with one or more aspects of the disclosed embodiments the substrate aligner is configured for one or more of detecting a missing substrate, detecting a substrate thickness, and monitoring in-situ movement, via feedback from the another motor of the accessory portion.

In accordance with one or more aspects of the disclosed embodiments the one or more drive motors comprises three motors, each of the three motors configured to drive a respective one of vertical or rotational motion of the articulated arm.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate transport apparatus comprising:
   a frame;
   a substrate transport arm connected to the frame, the substrate transport arm having an end effector, the end effector being coupled to the transport arm at a rotary joint; and
   a drive section having at least one motor coupled to the substrate transport arm, wherein the at least one motor defines a kinematic portion of the drive section configured to effect kinematic motion of the substrate transport arm displacing the end effector as a unit relative to the frame, and the drive section includes an accessory portion adjacent the kinematic portion, wherein the accessory portion has another motor, different and distinct from the at least one motor, the another motor of the accessory portion is operably coupled to and configured to drive one or more accessory device independent of the kinematic motion of the substrate transport arm and is disposed, with the at least one motor, separate and apart from the end effector and each link of the substrate transport arm so that the another motor is not dependent from the end effector and each link of the substrate transport arm; wherein the substrate transport arm is an articulated arm.

2. The substrate transport apparatus of claim 1, wherein the another motor of the accessory portion drives the one or more accessory device via at least one kinematic transmission coupling.

3. The substrate transport apparatus of claim 2, wherein the at least one kinematic transmission coupling extends across at least one articulated joint of the articulated arm.

4. The substrate transport apparatus of claim 1, wherein the one or more accessory device comprises one or more of a gripper mechanism, a wafer aligner, or an electric power generator.

5. The substrate transport apparatus of claim 4, wherein the gripper mechanism is configured to grip an edge of a wafer or vertically grip a topside and backside of the wafer.

6. The substrate transport apparatus of claim 4, wherein the wafer aligner is configured for one or more of detecting a missing wafer, detecting a wafer thickness, and monitoring in-situ movement, via feedback from the another motor of the accessory portion.

7. The substrate transport apparatus of claim 1, wherein the at least one motor is N number of motors providing the substrate transport arm with N degrees of freedom.

8. The substrate transport apparatus of claim 1, wherein the at least one motor comprises three motors, each of the three motors configured to drive a respective one of vertical, rotational, or horizontal plane motion of the substrate transport arm.

9. The substrate transport apparatus of claim 1, wherein the substrate transport apparatus comprises at least one tool for a processing apparatus.

10. The substrate transport apparatus of claim 1, wherein the at least one motor and the another motor of the drive section are coupled to a coaxial drive shaft arrangement for driving a respective one of the one or more accessory device and the kinematic motion of the substrate transport arm.

11. The substrate transport apparatus of claim 1, wherein the one or more accessory device is disposed on the substrate transport arm.

12. The substrate transport apparatus of claim 1, wherein the another motor of the drive section is disposed directly adjacent one of the at least one motor of the drive section.

13. The substrate transport apparatus of claim 1, wherein the another motor drives the one or more accessory device through a transmission coupling that extends through the substrate transport arm.

14. The substrate transport apparatus of claim 1, wherein one or more of the at least one motor and the another motor include rotors disposed within an isolated environment in which the substrate transport arm operates and stators disposed outside the isolated environment.

15. A method comprising:
   providing a frame of a substrate transport apparatus;
   providing a substrate transport arm connected to the frame, the substrate transport arm having an end effector, the end effector being coupled to the transport arm at a rotary joint;
   providing a drive section having at least one motor coupled to the substrate transport arm defining a kinematic portion of the drive section, and another motor adjacent the at least one motor, the another motor being different and distinct from the at least one motor and defining an accessory portion, the another motor being disposed, with the at least motor, separate and apart from the end effector and each link of the substrate transport arm so that the another motor is not dependent from the end effector and each link of the substrate transport arm;
   driving, with the at least one motor, kinematic motion of the substrate transport arm displacing the end effector relative to the frame as a unit; and
   driving, with the another motor, the one or more accessory device independent of the kinematic motion of the substrate transport arm; wherein the substrate transport arm is an articulated arm.

16. The method of claim 15, wherein the at least one motor is N number of motors providing the substrate transport arm with N degrees of freedom.

17. The method of claim 15, wherein the at least one motor comprises three motors, the method further comprising driving, with each of the three motors, a respective one of vertical, rotational, or horizontal plane motion of the substrate transport arm.

18. The method of claim 15, further comprising operating the one or more accessory device on the substrate transport arm in motion.

19. The method of claim 15, further comprising operating the one or more accessory device on the substrate transport arm at a wafer holding station.

20. The method of claim 15, further comprising driving, with at least one kinematic transmission coupling of the another motor of the accessory portion, the one or more accessory device.

21. The method of claim 20, wherein the at least one kinematic transmission coupling extends across at least one articulated joint of the articulated arm.

22. The method of claim 15, wherein the one or more accessory device comprises one or more of a gripper mechanism, a wafer aligner, or an electric power generator.

23. The method of claim 22, further comprising gripping, with the gripper mechanism, an edge of a wafer or vertically gripping a topside and backside of the wafer.

24. The method of claim 22, further comprising detecting, with the wafer aligner, a missing wafer, a wafer thickness, and/or monitoring in-situ movement, via feedback from the another motor of the accessory portion.

25. A workpiece transport apparatus comprising:
a frame;
a base drive section connected to the frame and having more than one drive motors;
an articulated arm having at least one end effector with at least one workpiece holding station thereon, and operably coupled to the base drive section wherein N number of the more than one drive motors are configured so as to coincidentally drive and effect kinematic motion of the articulated arm with N number of degrees of freedom (DOF), defined by the N number of the more than one drive motors, displacing the workpiece holding station relative to the frame along a motion path described by at least one of the N number of DOF; and
an accessory device connected to the articulated arm and operably coupled to the base drive section, wherein the base drive section has at least one drive motor, of the more than one drive motors, that is an accessory drive motor so that the accessory drive motor is not dependent from the end effector and each link of the articulated arm, the accessory drive motor being different and distinct from each of the N number of the more than one drive motors defining each of the N number of DOF describing each motion path of each workpiece holding station, the accessory drive motor being operably coupled to the accessory device so as to power the accessory device.

26. The workpiece transport apparatus of claim 25, wherein the more than one drive motors are in a common housing.

27. The workpiece transport apparatus of claim 25, wherein the more than one drive motors comprises three drive motors, each of the three drive motors configured to drive a respective one of vertical or rotational motion of the articulated arm.

28. The workpiece transport apparatus of claim 25, wherein the workpiece transport apparatus comprises at least one tool for a processing apparatus.

29. The workpiece transport apparatus of claim 25, wherein the accessory device has a DOF motion axis that is accessory to each motion path of each workpiece holding station.

30. The workpiece transport apparatus of claim 25, further comprising an accessory kinematic transmission operably coupling the accessory drive motor and accessory device, and having at least one kinematic transmission member movably mounted within an articulated arm portion of the articulated arm, through which kinematic transmission member drive torque, generated by the accessory drive motor is transferred to the accessory device so as to effect drive power of the accessory device independent of the N number of DOF of the kinematic motion of the articulated arm.

31. The workpiece transport apparatus of claim 25, wherein the accessory device comprises one or more of a gripper mechanism, a wafer aligner, or an electric power generator.

32. The workpiece transport apparatus of claim 31, wherein the gripper mechanism is configured to grip an edge of a wafer or vertically grip a topside and backside of the wafer.

33. The workpiece transport apparatus of claim 31, wherein the wafer aligner is configured for one or more of detecting a missing wafer, detecting a wafer thickness, and monitoring in-situ movement, via feedback from the another motor of the accessory portion.

* * * * *